(12) United States Patent
Yamada

(10) Patent No.: US 10,181,836 B2
(45) Date of Patent: Jan. 15, 2019

(54) RESONATOR ELEMENT, RESONATOR, OSCILLATOR, ELECTRONIC DEVICE, AND MOVING OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 432 days.

(21) Appl. No.: 14/931,376

(22) Filed: Nov. 3, 2015

(65) Prior Publication Data
US 2016/0056790 A1   Feb. 25, 2016

Related U.S. Application Data

(62) Division of application No. 14/105,643, filed on Dec. 13, 2013.

(30) Foreign Application Priority Data

Dec. 19, 2012 (JP) .................................. 2012-276555

(51) Int. Cl.
| | | |
|---|---|---|
| H03H 9/215 | (2006.01) | |
| H03B 5/32 | (2006.01) | |
| H03H 9/05 | (2006.01) | |
| H03H 9/10 | (2006.01) | |
| H03H 3/02 | (2006.01) | |

(52) U.S. Cl.
CPC .............. *H03H 9/215* (2013.01); *H03B 5/32* (2013.01); *H03H 3/02* (2013.01); *H03H 9/0547* (2013.01); *H03H 9/1021* (2013.01); *H03H 2003/026* (2013.01)

(58) Field of Classification Search
CPC .................................. H03H 9/21; H03H 9/215
USPC ........................................................... 310/370
See application file for complete search history.

(56) References Cited

U.S. PATENT DOCUMENTS

| | | |
|---|---|---|
| 4,540,909 A | 9/1985 | Takahashi et al. |
| 6,564,639 B1 | 5/2003 | Hatanaka et al. |
| 6,587,009 B2 | 7/2003 | Kitamura et al. |
| 7,084,556 B1 * | 8/2006 | Dalla Piazza ............ H03H 9/21 310/370 |
| 7,193,354 B2 | 3/2007 | Kawashima |
| 7,518,291 B2 | 4/2009 | Tanaya |

(Continued)

FOREIGN PATENT DOCUMENTS

| | | |
|---|---|---|
| JP | 53-136990 A | 11/1878 |
| JP | 50-81167 U | 7/1975 |

(Continued)

OTHER PUBLICATIONS

Aug. 4, 2015 Office Action issued in U.S. Appl. No. 14/105,643.

*Primary Examiner* — J. San Martin
(74) *Attorney, Agent, or Firm* — Oliff PLC

(57) ABSTRACT

A quartz crystal resonator element includes: a base portion and a pair of vibrating arms which extend from a first end portion of the base portion along a Y-axis direction. The base portion includes a second end portion provided on the opposite side to a first end portion in the Y-axis direction. The base portion is provided with a protrusion in at least one of a third end portion and a fourth end portion which respectively connect both ends of the first end portion and both ends of the second end portion.

16 Claims, 14 Drawing Sheets

(56) References Cited

U.S. PATENT DOCUMENTS

| | | |
|---|---|---|
| 8,053,957 B2 | 11/2011 | Sugiyama |
| 8,203,256 B2 | 6/2012 | Saito |
| 8,922,286 B2 | 12/2014 | Yamada et al. |
| 9,088,264 B2 | 7/2015 | Yamada |
| 2007/0188055 A1 | 8/2007 | Kuwahara |
| 2009/0021120 A1 | 1/2009 | Dalla Piazza et al. |
| 2010/0164331 A1 | 7/2010 | Yamada |
| 2010/0171397 A1 | 7/2010 | Yamada |
| 2010/0201229 A1* | 8/2010 | Saito .................. H03H 3/02 310/370 |

FOREIGN PATENT DOCUMENTS

| | | |
|---|---|---|
| JP | 52-129395 U | 10/1977 |
| JP | 53-59472 A | 5/1978 |
| JP | 54-3487 A | 1/1979 |
| JP | 54-7285 A | 1/1979 |
| JP | 55-37086 A | 3/1980 |
| JP | 55-171114 U | 12/1980 |
| JP | 59-19419 A | 1/1984 |
| JP | 59-138114 A | 8/1984 |
| JP | 59-183520 A | 10/1984 |
| JP | 60-21614 A | 2/1985 |
| JP | 61-187411 A | 8/1986 |
| JP | 03-10511 A | 1/1991 |
| JP | 2002141770 A | 5/2002 |
| JP | 2002-261575 A | 9/2002 |
| JP | 2002335142 A | 11/2002 |
| JP | 2003-069368 A | 3/2003 |
| JP | 2003198303 A | 7/2003 |
| JP | 2005236563 A | 9/2005 |
| JP | 2007201936 A | 8/2007 |
| JP | 2007258918 A | 10/2007 |
| JP | 2007324523 A | 12/2007 |
| JP | 200879014 A | 4/2008 |
| JP | 2008-177723 A | 7/2008 |
| JP | 2009206590 A | 9/2009 |
| JP | 201011352 A | 1/2010 |
| JP | 2010157933 A | 7/2010 |
| JP | 2010171965 A | 8/2010 |
| JP | 2010171966 A | 8/2010 |
| JP | 2010178064 A | 8/2010 |
| JP | 2010-278831 A | 12/2010 |
| JP | 2011-015101 A | 1/2011 |
| JP | 201145119 A | 3/2011 |
| JP | 2011151567 A | 8/2011 |
| JP | 2011151568 A | 8/2011 |
| JP | 4933903 B | 2/2012 |
| JP | 2012119920 A | 6/2012 |

* cited by examiner

RESONATOR ELEMENT, RESONATOR, OSCILLATOR, ELECTRONIC DEVICE, AND MOVING OBJECT

This is a Division of U.S. patent application Ser. No. 14/105,643 filed Dec. 13, 2013. The disclosure of the prior application is hereby incorporated by reference herein in its entirety.

BACKGROUND

1. Technical Field

The present invention relates to a resonator element, and a resonator, an oscillator, an electronic device, and a moving object, each of which includes the resonator element.

2. Related Art

Hitherto, as a piezoelectric device represented by a piezoelectric resonator (an example of a resonator) or a piezoelectric oscillator (an example of an oscillator), a piezoelectric device is known which has a configuration in which, in a package having a tuning fork type piezoelectric resonator element (an example of a resonator element) fixed in a cantilever manner and accommodated therein, between two protrusions that are disposed in parallel at a predetermined interval and protrude inward, a folded remainder from a parent material, which protrudes from the center of an end portion of a base portion of the piezoelectric resonator element is accommodated (for example, refer to JP-A-2003-69368). The piezoelectric resonator element (hereinafter, referred to as a resonator element) used in the piezoelectric device has a configuration in which the folded remainder is provided in an engagement recessed portion which is provided at the end portion of the base portion and is engaged with the two protrusions in the package.

In recent years, to further reduce the size of the piezoelectric device, more reduction in the size of the resonator element is necessary. Regarding the resonator element, vibration leakage from the base portion due to the reduction in size is one of issues.

The vibration leakage will be described with reference to the drawings.

FIG. 15 is a schematic plan view illustrating the schematic configuration of the resonator element according to the related art. In addition, in the figure, the X-axis, the Y-axis, and the Z-axis are mutually perpendicular coordinate axes.

As illustrated in FIG. 15, the resonator element 91 according to the related art includes a base portion 92, and a pair of vibrating arms 93a and 93b that extend in parallel along the Y-axis direction from one end portion 92a of the base portion 92. An engagement recessed portion 94 that is recessed in the +(positive) Y direction is provided at the other end portion 92b on the opposite side to one end portion 92a of the base portion 92, and a folded remainder 95 from a parent material is provided to protrude from the center of the engagement recessed portion 94 in the − (negative) Y direction.

According to an analysis using a simulation by the inventors, in reaction to flexural vibration in which the resonator element 91 is displaced to be bent alternately in a direction indicated by the arrows A (a direction in which the pair of vibrating arms 93a and 93b are separated from each other) and in a direction indicated by the arrows B (a direction in which the pair of vibrating arms 93a and 93b approach each other) about the root portions of the pair of vibrating arms 93a and 93b as the fulcrums, forces in a direction indicated by the arrow C (the +Y direction) and in a direction indicated by the arrow D (the −Y direction) are alternately exerted on the base portion 92.

In detail, when the pair of vibrating arms 93a and 93b are bent in the direction indicated by the arrows A, a force F1 in a clockwise direction is exerted on the +X side from the center in the X-axis direction of the base portion 92 about the root portion of the vibrating arm 93a.

On the other hand, a force F2 in a counterclockwise direction is exerted on the −X side from the center of the base portion 92 about the root portion of the vibrating arm 93b.

Here, the components of the forces F1 and F2 in the X-axis direction cancel each other because the magnitudes of the forces are the same and the directions in which the forces are exerted are opposite to each other.

On the other hand, the components of the forces F1 and F2 in the Y-axis direction are added to each other and are exerted on the base portion 92 as a force in a direction indicated by the arrow C because the magnitudes of the forces are the same and the directions in which the forces are exerted are the same. Similarly, when the pair of vibrating arms 93a and 93b are bent in the direction indicated by the arrows B, a force F3 in the counterclockwise direction is exerted on the +X side from the center of the base portion 92 about the root portion of the vibrating arm 93a.

On the other hand, a force F4 in the clockwise direction is exerted on the −X side from the center of the base portion 92 about the root portion of the vibrating arm 93b.

Here, the components of the forces F3 and F4 in the X-axis direction cancel each other because the magnitudes of the forces are the same and the directions in which the forces are exerted are opposite to each other.

On the other hand, the components of the forces F3 and F4 in the Y-axis direction are added to each other and are exerted on the base portion 92 as a force in a direction indicated by the arrow D because the magnitudes of the forces are the same and the directions in which the forces are exerted are the same. In this case, since the engagement recessed portion 94 is provided in the base portion 92 of the resonator element 91, compared to a case where the engagement recessed portion 94 is not provided, the rigidity of the base portion 92 (particularly the rigidity of the center part) is reduced. Accordingly, the base portion 92 of the resonator element 91 cannot resist the forces in the direction indicated by the arrow C and the direction indicated by the arrow D and is displaced (vibrates) alternately in the direction indicated by the arrow C and in the direction indicated by the arrow D.

As a result, when the base portion 92 is fixed to a package (not illustrated) or the like, in the resonator element 91, a portion of vibrational energy generated by the flexural vibration of the pair of vibrating arms 93a and 93b leaks to the package or the like via a fixing member such as an adhesive that fixes the base portion 92 (vibration leakage).

As a measure to reduce the vibration leakage, for example, in a case where the engagement recessed portion 94 is removed so as to enhance the rigidity of the base portion 92, the folded remainder 95 directly protrudes from the other end portion 92b in the −Y direction.

As a result, in this measure, the size of the resonator element 91 in the Y-axis direction is increased, and thus there is a problem in that the measure goes against the reduction in the size.

SUMMARY

An advantage of some aspects of the invention is to solve at least a part of the problems described above, and the invention can be implemented as the following forms or application examples.

APPLICATION EXAMPLE 1

This application example is directed to a resonator element including: a base portion which includes a first end portion and a second end portion disposed on the opposite side to the first end portion in a plan view; a pair of vibrating arms which extend from the first end portion of the base portion along a first direction on the opposite side to the second end portion side; and a protrusion integrally provided with the base portion, in which the second end portion of the base portion includes a reduced width portion whose width along a second direction intersecting the first direction is reduced from the first end portion of the base portion along the first direction, and the protrusion is provided in at least one of the third end portion and the fourth end portion which respectively connect both ends of the first end portion and both ends of the second end portion.

Accordingly, in the resonator element, the base portion includes the reduced width portion which is provided so that a distance along the first direction, from an second direction virtual line that passes between the first end portion (corresponding to one end portion 92a in FIG. 15) and the second end portion (corresponding to the other end portion 92b in FIG. 15) along the second direction (corresponding to the X-axis direction in FIG. 15) perpendicular to the first direction (corresponding to the Y-axis direction in FIG. 15), to at least one of the first end portion and the second end portion is reduced with distance from the first direction virtual line that passes through the center between the pair of vibrating arms along the first direction.

Therefore, in the resonator element, in other words, by the reduced width portion in which a region (width) along the first direction is increased toward the center from both ends of the first end portion (and/or both ends of the second end portion) in the base portion, flexural deformation of the pair of vibrating arms is caught on the reduced width portion and thus deformation of the base portion is suppressed.

As a result, in the resonator element, vibration of the base portion in the direction indicated by the arrow C and the direction indicated by the arrow D as in FIG. 15 is suppressed, and thus vibration leakage via the base portion can be reduced. In addition, an improvement in the rigidity of the base portion by the reduced width portion having the above configuration is based on the knowledge obtained by an analysis using a simulation by the inventors.

Moreover, in at least one of the third end portion and the fourth end portion which respectively connect both ends of the first end portion and both ends of the second end portion of the base portion, the protrusion (corresponding to a folded remainder) from a parent material is provided. That is, in the resonator element, in other words, since the protrusion protrudes along the second direction, the rigidity of the base portion can be enhanced without an increase in size in the first direction due to the protrusion.

Furthermore, the protrusion provided in the base portion functions as an alignment marker when the resonator element is mounted in a package, and exhibits an excellent effect in controlling the mounting position of the resonator element with high accuracy.

APPLICATION EXAMPLE 2

In the resonator element according to the application example described above, it is preferable that the protrusion includes a thinner region than the base portion in a third direction perpendicular to the first direction and the second direction. Accordingly, in the resonator element, since the protrusion includes the region thinner than the base portion in the third direction (corresponding to the Z-axis direction in FIG. 15) perpendicular to the first direction and the second direction, the strength of the protrusion is partially reduced, thus separation thereof from the parent material by folding becomes easier.

APPLICATION EXAMPLE 3

In the resonator element according to the application example described above, it is preferable that the protrusion is provided in a partial region of at least one of the third end portion and the fourth end portion in the plan view.

Accordingly, in the resonator element, since the protrusion is provided in a partial region of the third end portion and the fourth end portion in the plan view, for example, compared to a case where the protrusion is provided in the entire regions of the third end portion and the fourth end portion, the strength of the protrusion is reduced, and thus separation from the parent material becomes easier.

APPLICATION EXAMPLE 4

In the resonator element according to the application example described above, it is preferable that the vibrating arm includes: an arm portion connected to the base portion; and a mass portion which is connected to the arm portion and whose width along the second direction is greater than that of the arm portion.

Accordingly, in the resonator element, since each of the pair of vibrating arms includes the arm portion connected to the base portion and the mass portion which is connected to the arm portion and whose width along the second direction is greater than that of the arm portion, the widths of the pair of vibrating arms along the second direction are increased so as to compensate for a reduction in a flexural vibration frequency due to an increase in inertial mass. Therefore, a path necessary for a temperature difference caused by the flexural vibration to diffuse is lengthened.

Accordingly, in the resonator element, in an adiabatic region which is a region where the flexural vibration frequency (mechanical flexural vibration frequency) f is greater than a thermal relaxation frequency f0 (f>f0), thermoelastic loss is reduced and thus a Q value (which is a dimensionless number representing a vibration state, and as this value is increased, vibration becomes stable) is increased. In the resonator element, due to the effect of increasing the Q value, for example, the vibrating arm can be shortened while maintaining the Q value. That is, in the resonator element, while the Q value is maintained by the mass portion, a reduction in size can be achieved.

APPLICATION EXAMPLE 5

In the resonator element according to the application example described above, it is preferable that a distance from a first direction virtual line to an end portion of the protrusion in the second direction is shorter than a distance from the first direction virtual line to an end portion of the mass portion in the second direction.

Accordingly, in the resonator element, in other words, since a protruding amount of the protrusion in the second direction from the base portion is smaller than a protruding amount of the mass portion in the second direction from the base portion, the protrusion can be provided without the increase in the maximum size in the second direction.

APPLICATION EXAMPLE 6

In the resonator element according to the application example described above, it is preferable that the resonator element further includes a holding portion which extends from the first end portion of the base portion between the pair of vibrating arms along the first direction.

Accordingly, in the resonator element, since the holding portion which extends from the first end portion of the base portion between the pair of vibrating arms along the first direction is included, compared to a case where the holding portion is absent, for example, fixing to an external member such as a package can be easily performed via the holding portion.

APPLICATION EXAMPLE 7

In the resonator element according to the application example described above, it is preferable that an outer edge of the reduced width portion has a curve shape.

Accordingly, in the resonator element, since the outer edge of the reduced width portion is formed in the curve shape, the resonator element can easily resist the forces in the direction indicated by the arrow C and the direction indicated by the arrow D as illustrated in FIG. 15, and the flexural deformation of the pair of vibrating arms is further effectively caught on the reduced width portion. Therefore, the deformation of the base portion can be further suppressed. Accordingly, in the resonator element, the vibration of the base portion is suppressed, and thus the vibration leakage via the base portion can be further reduced.

APPLICATION EXAMPLE 8

This application example is directed to a resonator including: the resonator element described in any one of the application examples; and a container which accommodates the resonator element.

Accordingly, since the resonator having the above configuration includes the resonator element described in any one of the application examples and the container which accommodates the resonator element, the resonator which has excellent performance that reflects the effects described in the application examples can be provided.

APPLICATION EXAMPLE 9

This application example is directed to an oscillator including: the resonator element described in any one of the application examples; and an oscillation circuit which causes the resonator element to oscillate.

Accordingly, since the oscillator having the above configuration includes the resonator element described in any one of the application examples and the oscillation circuit which causes the resonator element to oscillate, the oscillator which has excellent performance that reflects the effects described in the application examples can be provided.

APPLICATION EXAMPLE 10

This application example is directed to an electronic device including the resonator element described in any one of the application examples.

Accordingly, since the electronic device having the above configuration includes the resonator element described in any one of the application examples, the electronic device which has excellent performance that reflects the effects described in the application examples can be provided.

APPLICATION EXAMPLE 11

This application example is directed to a moving object including the resonator element described in any one of the application examples.

Accordingly, since the moving object having the above configuration includes the resonator element described in any one of the application examples, the moving object which has excellent performance that reflects the effects described in the application examples can be provided.

BRIEF DESCRIPTION OF THE DRAWINGS

The invention will be described with reference to the accompanying drawings, wherein like numbers reference like elements.

FIGS. 1A and 1B are schematic diagrams illustrating a schematic configuration of a quartz crystal resonator element of a first embodiment, in which FIG. 1A is a schematic plan view, and FIG. 1B is a schematic cross-sectional view taken along the line E-E of FIG. 1A.

FIGS. 2A and 2B are schematic diagrams illustrating a schematic configuration of a quartz crystal resonator element of Modification Example 1 of the first embodiment, in which FIG. 2A is a schematic plan view, and FIG. 2B is a schematic cross-sectional view taken along the line G-G of FIG. 2A.

FIGS. 3A and 3B are schematic diagrams illustrating a schematic configuration of a quartz crystal resonator element of Modification Example 2 of the first embodiment, in which FIG. 3A is a schematic plan view, and FIG. 3B is a schematic cross-sectional view taken along the line E-E of FIG. 3A.

FIGS. 4A and 4B are schematic diagrams illustrating a schematic configuration of a quartz crystal resonator element of Modification Example 3 of the first embodiment, in which FIG. 4A is a schematic plan view, and FIG. 4B is a schematic cross-sectional view taken along the line E-E of FIG. 4A.

FIGS. 5A and 5B are schematic diagrams illustrating a schematic configuration of a quartz crystal resonator element of Modification Example 4 of the first embodiment, in which FIG. 5A is a schematic plan view, and FIG. 5B is a schematic cross-sectional view taken along the line E-E of FIG. 5A.

FIGS. 6A and 6B are schematic diagrams illustrating a schematic configuration of a quartz crystal resonator element of a second embodiment, in which FIG. 6A is a schematic plan view, and FIG. 6B is a schematic cross-sectional view taken along the line E-E of FIG. 6A.

FIGS. 7A and 7B are schematic diagrams illustrating a schematic configuration of a quartz crystal resonator element of Modification Example 1 of the second embodiment, in which FIG. 7A is a schematic plan view, and FIG. 7B is a schematic cross-sectional view taken along the line G-G of FIG. 7A.

FIGS. 8A and 8B are schematic diagrams illustrating a schematic configuration of a quartz crystal resonator element of Modification Example 2 of the second embodiment, in which FIG. 8A is a schematic plan view, and FIG. 8B is a schematic cross-sectional view taken along the line E-E of FIG. 8A.

FIGS. 9A and 9B are schematic diagrams illustrating a schematic configuration of a quartz crystal resonator element of Modification Example 3 of the second embodiment, in which FIG. 9A is a schematic plan view, and FIG. 9B is a schematic cross-sectional view taken along the line E-E of FIG. 9A.

FIGS. 10A and 10B are schematic diagrams illustrating a schematic configuration of a quartz crystal resonator element of Modification Example 4 of the second embodiment, in which FIG. 10A is a schematic plan view, and FIG. 10B is a schematic cross-sectional view taken along the line E-E of FIG. 10A.

FIGS. 11A and 11B are schematic diagrams illustrating a schematic configuration of a quartz crystal resonator of a third embodiment, in which FIG. 11A is a schematic plan view viewed from a lid side, and FIG. 11B is a schematic cross-sectional view taken along the line H-H of FIG. 11A.

FIGS. 12A and 12B are schematic diagrams illustrating a schematic configuration of a quartz crystal oscillator of a fourth embodiment, in which FIG. 12A is a schematic plan view viewed from a lid side, and FIG. 12B is a schematic cross-sectional view taken along the line H-H of FIG. 12A.

DESCRIPTION OF EXEMPLARY EMBODIMENTS

Hereinafter, exemplary embodiments of the invention will be described with reference to the drawings.

First Embodiment

First, a quartz crystal resonator element as an example of a resonator element will be described.

Figure 1A:
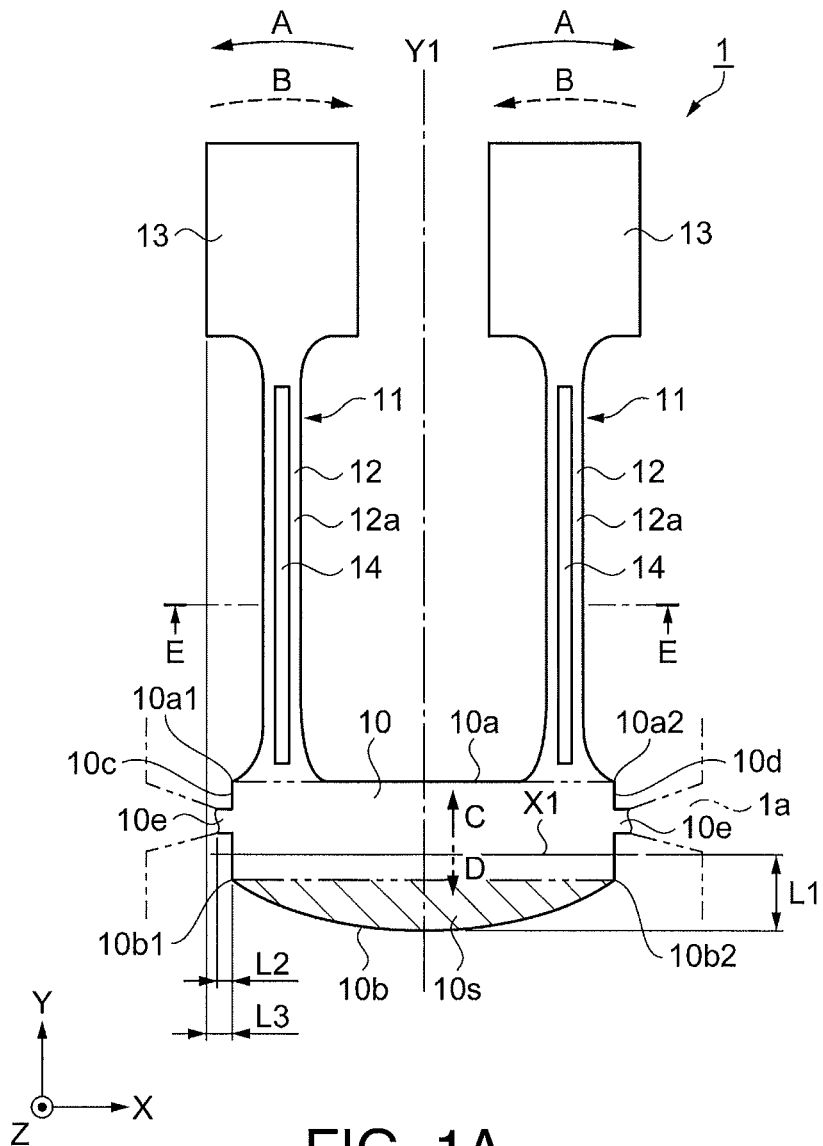
Figure 1B:
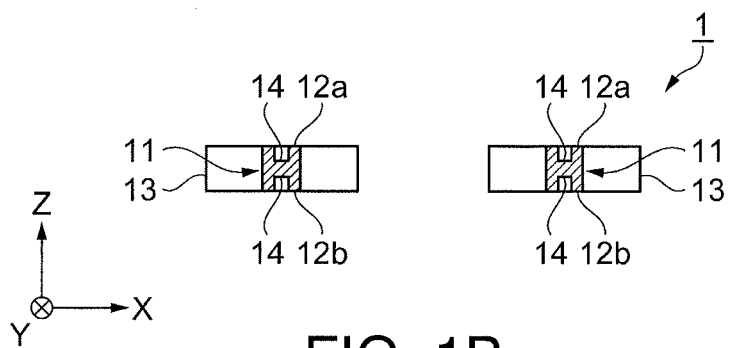

FIGS. 1A and 1B are schematic diagrams illustrating a schematic configuration of the quartz crystal resonator element of the first embodiment. FIG. 1A is a schematic plan view, and FIG. 1B is a schematic cross-sectional view taken along the line E-E of FIG. 1A. In addition, in each of the following drawings, for easy understanding, the dimension ratio of each constituent element is different from its actual dimension ratio. In addition, the X-axis, the Y-axis, and the Z-axis in each of the drawings are mutually perpendicular coordinate axes. As illustrated in FIGS. 1A and 1B, the quartz crystal resonator element 1 includes a base portion 10 having a substantially flat plate shape, and a pair of vibrating arms 11 which are provided on the +Y side of the base portion 10 and extend in parallel along the Y-axis direction as a first direction from a first end portion 10a that extends along the X-axis direction. The base portion 10 includes the first end portion 10a in the Y-axis direction and a second end portion 10b on the opposite side thereto (−Y side).

The base portion 10 includes a reduced width portion 10s (a hatched region in FIG. 1A) which is provided so that a distance L1 along the Y-axis direction, from an X-axis direction reference line X1 that passes between the first end portion 10a and the second end portion 10b as a second direction virtual line along the X-axis direction as a second direction perpendicular to the Y-axis direction, to at least one (here, to the second end portion 10b) of the first end portion 10a and the second end portion 10b is reduced with distance from a Y-axis direction reference line Y1 that passes through the center between the pair of vibrating arms 11 as a first direction virtual line along the Y-axis direction.

The outer edge (the second end portion 10b) of the reduced width portion 10s is formed in a curve shape. Specifically, the outer edge of the reduced width portion 10s is formed in an arc shape whose center is set on the Y-axis direction reference line Y1 and which has a constant curvature. In addition, during etching of a quartz crystal, the outer edge is microscopically shown in a shape of continuous short straight lines. However, even in this case, the outer edge is regarded as being formed in the curve shape.

A plurality of the quartz crystal resonator elements 1 are obtained from a single quartz crystal wafer (parent material 1a) which is cut from rough quartz crystal (lumbered) at a predetermined angle (for example, Z cut in which the Z-axis (optical axis) of the quartz crystal is a thickness direction) using a technique such as photolithography or etching. Accordingly, in the base portion 10 of the quartz crystal resonator element 1, a protrusion 10e from the parent material 1a is provided in at least one of (here, both) a third end portion 10c and a fourth end portion 10d which respectively connect both ends 10a1 and 10a2 of the first end portion 10a and both ends 10b1 and 10b2 of the second end portion 10b.

The third end portion 10c that connects the end 10a1 of the first end portion 10a to the end 10b1 of the second end portion 10b and the fourth end portion 10d that connects the end 10a2 of the first end portion 10a to the end 10b2 of the second end portion 10b extend along the Y-axis direction, and the protrusion 10e is provided to protrude from partial regions of the third end portion 10c and the fourth end portion 10d along the X-axis direction in the plan view.

Each of the pair of vibrating arms 11 of the quartz crystal resonator element 1 includes an arm portion 12 having a substantially prismatic shape which is connected to the base portion 10, and a mass portion 13 having a substantially rectangular flat plate shape which is connected to the arm portion 12 and has a width along the X-axis direction greater than that of the arm portion 12.

A bottomed groove portion 14 which extends along the Y-axis direction is formed in each of both principal surfaces 12a and 12b of the arm portion 12 perpendicular to the Z-axis direction. As illustrated in FIG. 1B, the cross-sectional shape along the X-axis direction of the arm portion 12 including the groove portion 14 is in a substantially H shape.

A protruding amount L2 of the protrusion 10e in the X-axis direction from the base portion 10, specifically from the third end portion 10c (the fourth end portion 10d) is preferably smaller than a protruding amount L3 of the mass portion 13 in the X-axis direction from the third end portion 10c (the fourth end portion 10d) of the base portion 10.

In other words, the distance from the Y-axis direction reference line Y1 to an end portion of the protrusion 10e in the X-axis direction is preferably shorter than the distance from the Y-axis direction reference line Y1 to an end portion of the mass portion 13 in the X-axis direction. Accordingly, the quartz crystal resonator element 1 having a small size in the X-axis direction can be obtained.

Here, the operation of the quartz crystal resonator element 1 will be described.

A pair of excitation electrodes (not illustrated) are respectively formed in the pair of vibrating arms 11 of the quartz crystal resonator element 1, and a pair of terminal electrodes (not illustrated) drawn from the excitation electrodes are formed in the base portion 10.

An electric field is generated by a drive signal (alternating voltage) applied to the excitation electrodes from the outside via the terminal electrodes, and flexural vibration is generated in which the quartz crystal resonator element 1 is bent alternately in a direction indicated by the arrow A (a direction in which the pair of vibrating arms 11 are separated from each other) and in a direction indicated by the arrow B (a direction in which the pair of vibrating arms 11 approach each other) about the root portions of the pair of vibrating arms 11 as the fulcrums by a piezoelectric effect of the quartz crystal.

As described above, by the flexural vibration about the root portions of the pair of vibrating arms 11 as the fulcrums, forces in a direction indicated by the arrow C and in a direction indicated by the arrow D are alternately exerted on the base portion 10.

Figure 15:
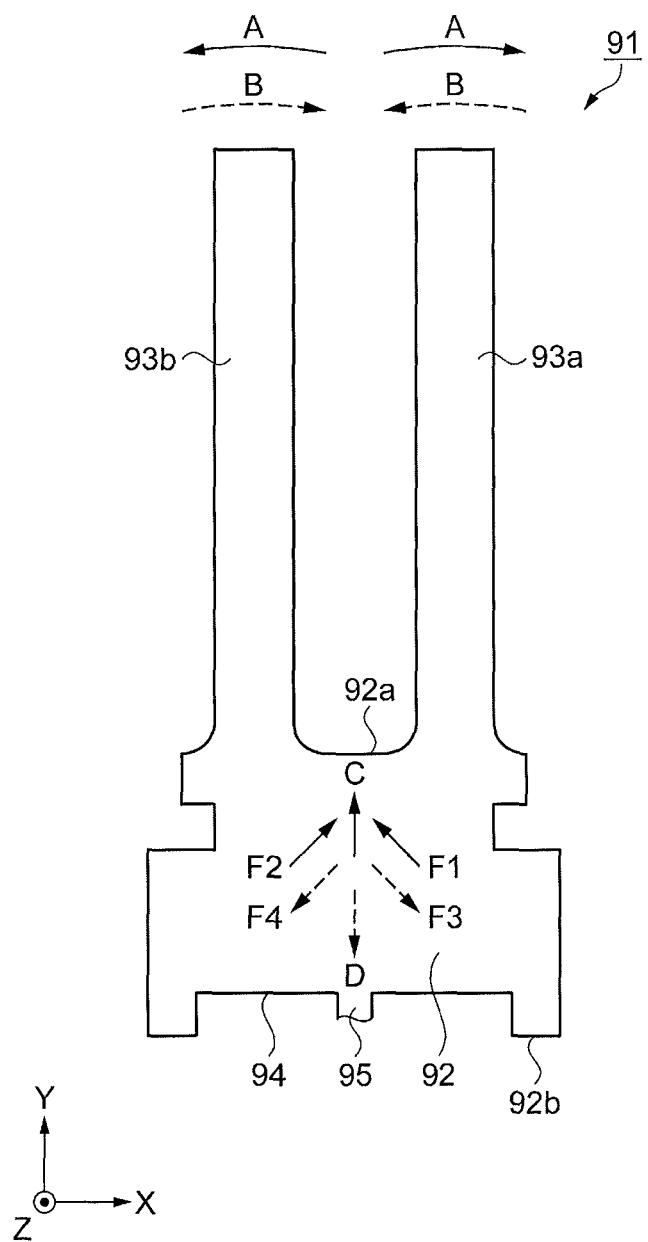
FIG. 15 is a schematic plan view illustrating a schematic configuration of a resonator element according to the related art.

Here, the reduced width portion 10s is provided in the base portion 10 of the quartz crystal resonator element 1. Accordingly, in the quartz crystal resonator element 1, in other words, by the reduced width portion 10s in which the region (width) along the Y-axis direction is increased toward the center (the Y-axis direction reference line Y1) from both ends 10b1 and 10b2 of the second end portion 10b (both ends 10a1 and 10a2 of the first end portion 10a) in the base portion 10, deformation which occurs in the base portion due to the flexural vibration of the vibrating arms 11 is caught on the reduced width portion 10s and is thus suppressed. Therefore, compared to the quartz crystal resonator element 91 according to the related art provided with the engagement recessed portion 94 as illustrated in FIG. 15, the deformation (particularly, deformation of the center part in the X-axis direction) of the base portion 10 is further suppressed. As a result, in the quartz crystal resonator element 1, vibration in the base portion 10 in the direction indicated by the arrow C and in the direction indicated by the arrow D is suppressed. Therefore, vibration leakage via a fixing portion which is formed in a principal surface (the same surfaces as the principal surfaces 12a and the 12b of the arm portion 12) of at least one of the front and rear surfaces of the base portion 10 and is connected to a package can be reduced. In addition, an improvement in the rigidity of the base portion by the reduced width portion 10s having the above configuration is based on the knowledge obtained by an analysis using a simulation by the inventors.

As described above, in the quartz crystal resonator element 1 of this embodiment, the base portion 10 includes the reduced width portion 10s which is provided so that the distance L1 along the Y-axis direction, from the X-axis direction reference line X1 that passes between the first end portion 10a and the second end portion 10b of the base portion 10 along the X-axis direction perpendicular to the Y-axis direction, to the second end portion 10b, is reduced with distance from the Y-axis direction reference line Y1 that passes through the center between the pair of vibrating arms 11 along the Y-axis direction.

Accordingly, in the quartz crystal resonator element 1, by the reduced width portion 10s in which the region (width) along the Y-axis direction is increased toward the center (the Y-axis direction reference line Y1) from both ends 10b1 and 10b2 of the second end portion 10b in the base portion 10, flexural deformation of the vibrating arms 11 is caught on the reduced width portion 10s. Therefore, the deformation of the base portion 10 is suppressed.

As a result, in the quartz crystal resonator element 1, vibration in the base portion 10 in the direction indicated by the arrow C and in the direction indicated by the arrow D is suppressed, and the vibration leakage via the base portion 10 can be reduced.

In addition, in this embodiment, the reduced width portion 10s is provided on the opposite side to the side where the vibrating arms 11 of the base portion 10 are provided. However, the reduced width portion 10s is not limited thereto and may be provided on the side where the vibrating arm 11 of the base portion 10 is provided or may be provided on both sides of the base portion 10 in the Y-axis direction.

Moreover, in the quartz crystal resonator element 1, the protrusion 10e from the parent material 1a is provided in the third end portion 10c and the fourth end portion 10d which respectively connect both ends 10a1 and 10a2 of the first end portion 10a and both ends 10b1 and 10b2 of the second end portion 10b of the base portion 10.

That is, in the quartz crystal resonator element 1, since the protrusion 10e protrudes along the X-axis direction, the rigidity of the base portion 10 can be improved without an increase in size in the Y-axis direction by the protrusion 10e. In addition, in the quartz crystal resonator element 1, since the protrusions 10e are provided in the partial regions of the third end portion 10c and the fourth end portion 10d in the plan view, for example, compared to a case where the protrusions 10e are provided in the entire regions of the third end portion 10c and the fourth end portion 10d, the strength of the protrusion 10e is reduced, and thus separation (folding) from the parent material 1a becomes easier.

Otherwise, the protrusions 10e may also be provided in the entire regions of the third end portion 10c and the fourth end portion 10d in the plan view. Accordingly, in the quartz crystal resonator element 1, the strength of the protrusion 10e is increased, and thus unintended separation from the parent material 1a in a manufacturing process or the like can be prevented.

In addition, in the quartz crystal resonator element 1, the protrusion 10e provided in the base portion 10 functions as, for example, an alignment marker when the quartz crystal resonator element 1 is mounted in a package or the like, and exhibits an excellent effect in controlling the mounting position of the quartz crystal resonator element 1 with high accuracy.

In addition, in the quartz crystal resonator element 1, since each of the pair of vibrating arms 11 includes the arm portion 12 connected to the base portion 10 and the mass portion 13 which is connected to the arm portion 12 and has a larger width in the X-axis direction than that of the arm portion 12, the widths of the pair of vibrating arms along the second direction are increased so as to compensate for a reduction in a flexural vibration frequency due to an increase in inertial mass. Therefore, a path necessary for a temperature difference caused by the flexural vibration to diffuse is lengthened. Accordingly, in the quartz crystal resonator element 1, in an adiabatic region which is a region where the flexural vibration frequency is greater than a thermal relaxation frequency, thermoelastic loss is reduced and thus a Q value is increased. In the quartz crystal resonator element 1, due to the effect of increasing the Q value, for example, the vibrating arm 11 can be shortened while maintaining the Q value. That is, in the quartz crystal resonator element 1, while the Q value is maintained by the mass portion 13, a reduction in size can be achieved.

In addition, the mass portion 13 may have a shape having different widths on the tip end side and on the arm portion 12 side along the X-axis direction (for example, the tip end side is wide and the arm portion 12 side is narrow). Specifically, the outline of the mass portion 13 which extends in the Y-axis direction may have a tapered shape or a step shape in which the tip end side is wide and the arm portion 12 side is narrow.

In addition, in the quartz crystal resonator element 1, since the protruding amount L2 of the protrusion 10e in the X-axis direction from the base portion 10 (the third end portion 10c and the fourth end portion 10d) is smaller than the protruding amount L3 of the mass portion 13 in the X-axis direction from the base portion 10, the protrusions 10e can be provided without the increase in the maximum size in the X-axis direction. Otherwise, in the quartz crystal resonator element 1, the protruding amount L2 may be the same as the protruding amount L3 or may be greater than the protruding amount L3. Accordingly, in the quartz crystal resonator element 1, since the protruding amount L2 of the protrusion 10e from the base portion 10 is large, an effect (for example, occurrence of cracks or defects which reach the base portion 10) on the base portion 10 during the separation from the parent material 1a can be reduced. In addition, in the quartz crystal resonator element 1, since the outer edge of the reduced width portion 10s is formed in the curve shape, the quartz crystal resonator element 1 can easily resist the forces in the direction indicated by the arrow C and the direction indicated by the arrow D, the deformation of the base portion 10 can be further suppressed. Accordingly, in the quartz crystal resonator element 1, the vibration of the base portion 10 is suppressed, and thus the vibration leakage via the base portion 10 can be further reduced. In addition, the outer edge of the reduced width portion 10s may have a shape in which the point of intersection with the Y-axis direction reference line Y1 in the figure and both ends 10b1 and 10b2 of the second end portion 10b are connected by straight lines.

Otherwise, the reduced width portion 10s may be provided on the first end portion 10a side or may be provided on both of the first end portion 10a side and the second end portion 10b side. In the quartz crystal resonator element 1, even in any case, the rigidity of the base portion 10 can be improved. In addition, since the groove portion 14 is formed in the vibrating arm 11, the quartz crystal resonator element 1 is configured so that heat generated by the flexural vibration is less likely to diffuse (heat transfer) by the groove portion 14. Accordingly, in the quartz crystal resonator element 1, in the adiabatic region which is a region where the flexural vibration frequency (mechanical flexural vibration frequency) f is greater than the thermal relaxation frequency f0 (f>f0), the thermoelastic loss (vibrational energy loss due to the transfer of heat generated between a contracted portion and an extending portion of the resonator element during the flexural vibration) can be suppressed. In addition, the groove portion 14 may not be provided in an isothermal region which is a region where the flexural vibration frequency (mechanical flexural vibration frequency) f is smaller than the thermal relaxation frequency f0 (f<f0) in order to suppress the thermoelastic loss.

Next, modification examples of the first embodiment will be described.

Modification Example 1

Figure 2A:
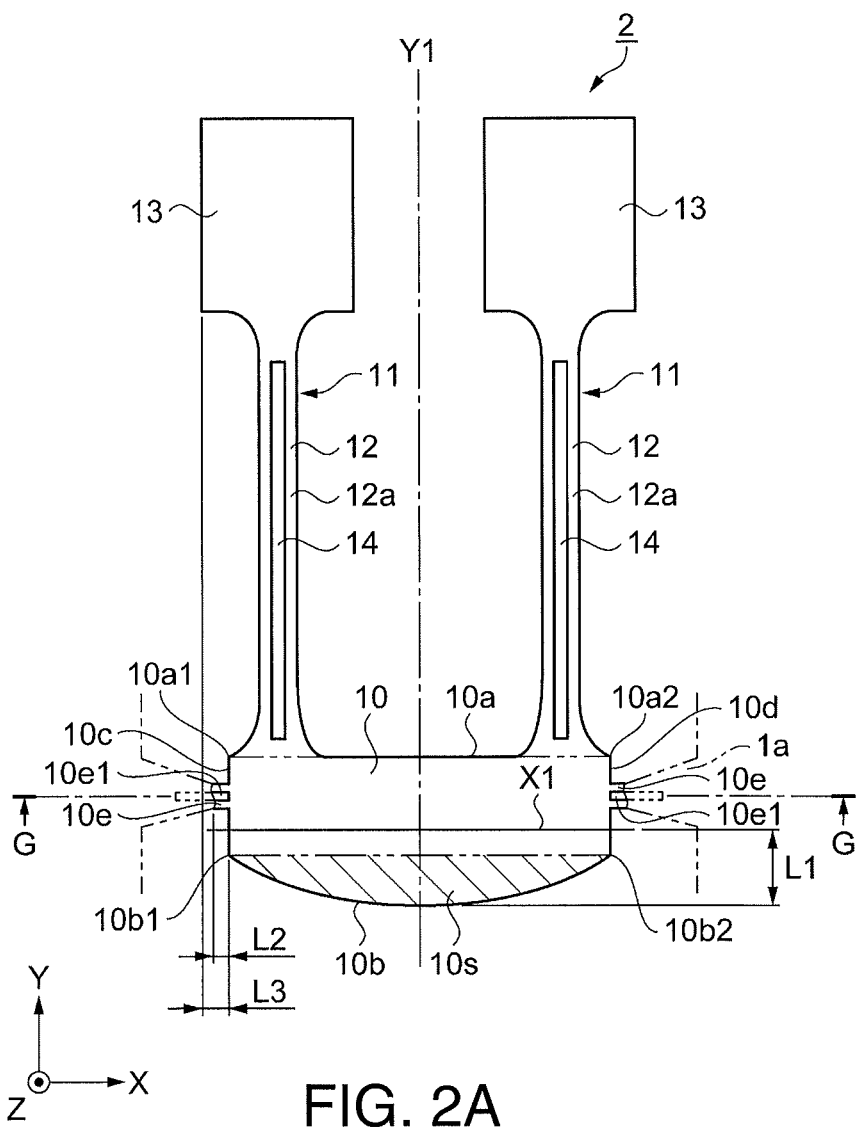
Figure 2B:
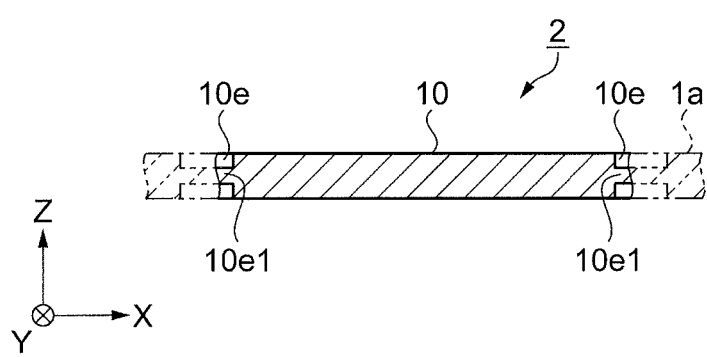

FIGS. 2A and 2B are schematic diagrams illustrating a schematic configuration of a quartz crystal resonator element of Modification Example 1 of the first embodiment. FIG. 2A is a schematic plan view, and FIG. 2B is a schematic cross-sectional view taken along the line G-G of FIG. 2A. In addition, like elements as those of the first embodiment are denoted by like reference numerals, and the detailed description thereof will be omitted. In addition, different parts from those of the first embodiment will be mainly described.

As illustrated in FIGS. 2A and 2B, a quartz crystal resonator element 2 of Modification Example 1 is different from the first embodiment in the configuration of the protrusion 10e of the base portion 10.

In the quartz crystal resonator element 2, the protrusion 10e includes a thin portion 10e1 as a part thinner than the base portion 10 in the Z-axis direction as a third direction perpendicular to the Y-axis direction and the X-axis direction. In addition, the thin portion 10e1 interposed between the bottomed grooves extending along the X-axis direction can be formed together when the groove portions 14 of the pair of vibrating arms 11 are formed by etching.

As described above, in the quartz crystal resonator element 2 of Modification Example 1, since the protrusion 10e includes the thin portion 10e1 thinner than the base portion 10 in the Z-axis direction perpendicular to the Y-axis direction and the X-axis direction, the strength of the protrusion 10e is partially reduced, thus separation from the parent material 1a by folding becomes easier than the first embodiment. In addition, in FIGS. 2A and 2B, the thin portion 10e1 is formed by providing grooves on both sides of the protrusion 10e in the Z-axis direction, but may also be formed by providing a groove on any one of the sides. In this case, in the quartz crystal resonator element 2, the surface on the other side of the protrusion 10e remains flat. Therefore, a pair of connection electrodes (not illustrated) which are electrically connected to the parent material 1a from the pair of terminal electrodes (not illustrated) of the base portion 10 can be easily formed at the surface on the other side of the protrusion 10e.

In addition, the groove may not be formed over the entire region of the protrusion 10e in the X-axis direction but may be partially formed. Otherwise, the groove may also be formed over the entire region as illustrated in FIGS. 2A and 2B. Furthermore, the groove may also have a shape extending along the Y-axis direction.

In addition, the configuration of the protrusion 10e of Modification Example 1 can also be applied to each of modification examples described below.

Modification Example 2

Figure 3A:
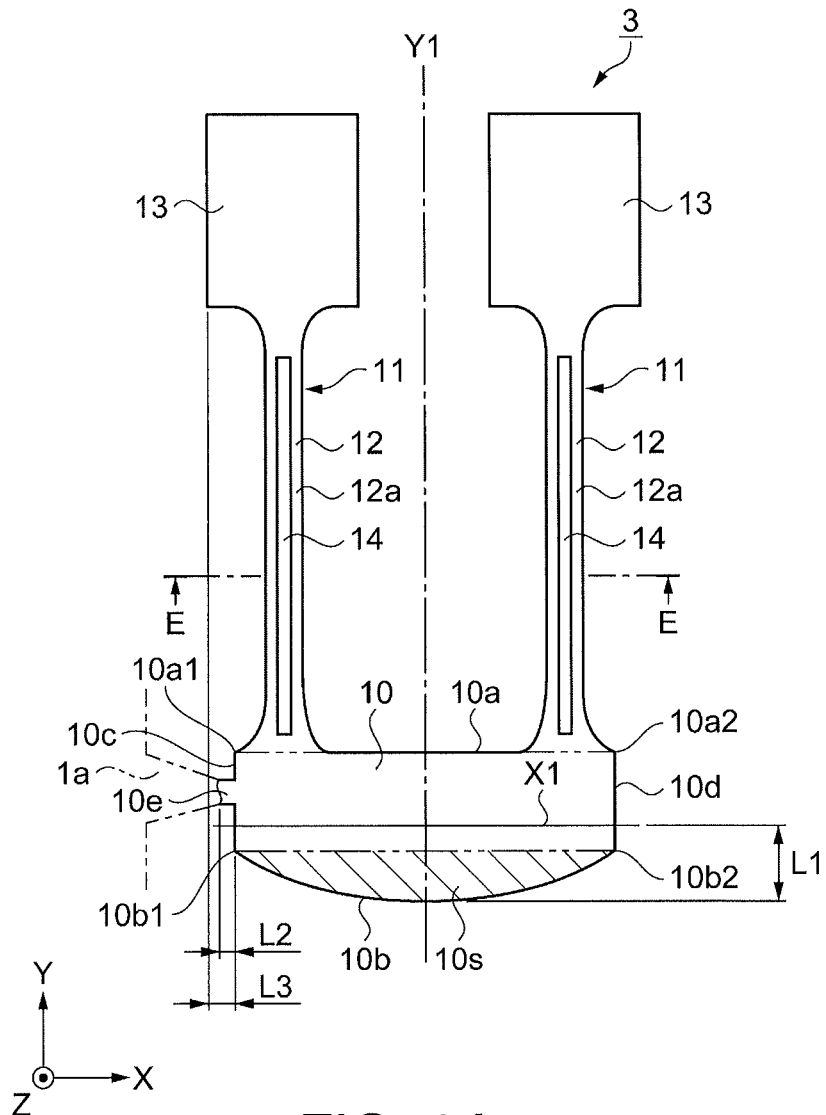
Figure 3B:
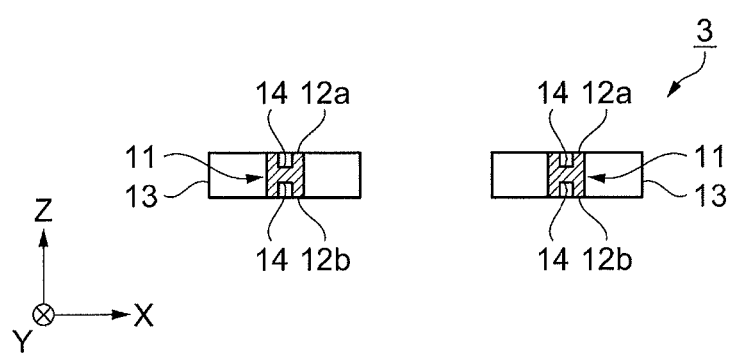

FIGS. 3A and 3B are schematic diagrams illustrating a schematic configuration of a quartz crystal resonator element of Modification Example 2 of the first embodiment. FIG. 3A is a schematic plan view, and FIG. 3B is a schematic cross-sectional view taken along the line E-E of FIG. 3A. In addition, like elements as those of the first embodiment are denoted by like reference numerals, and the detailed description thereof will be omitted. In addition, different parts from those of the first embodiment will be mainly described.

As illustrated in FIGS. 3A and 3B, a quartz crystal resonator element 3 of Modification Example 2 is different from the first embodiment in the configuration of the protrusion 10e of the base portion 10.

In the quartz crystal resonator element 3, the protrusion 10e is provided in one (here, the third end portion 10c) of the third end portion 10c and the fourth end portion 10d of the base portion 10.

As described above, in the quartz crystal resonator element 3, since the protrusion 10e is provided in one of the third end portion 10c and the fourth end portion 10d of the base portion 10, a point of separation from the parent material 1a is one, and thus separation (folding) from the parent material 1a becomes easier than the case where the protrusions 10e are provided in both the third end portion 10c and the fourth end portion 10d.

In addition, the configuration of the protrusion 10e of Modification Example 2 can also be applied to the above modification example and each of modification examples described below.

Modification Example 3

Figure 4A:
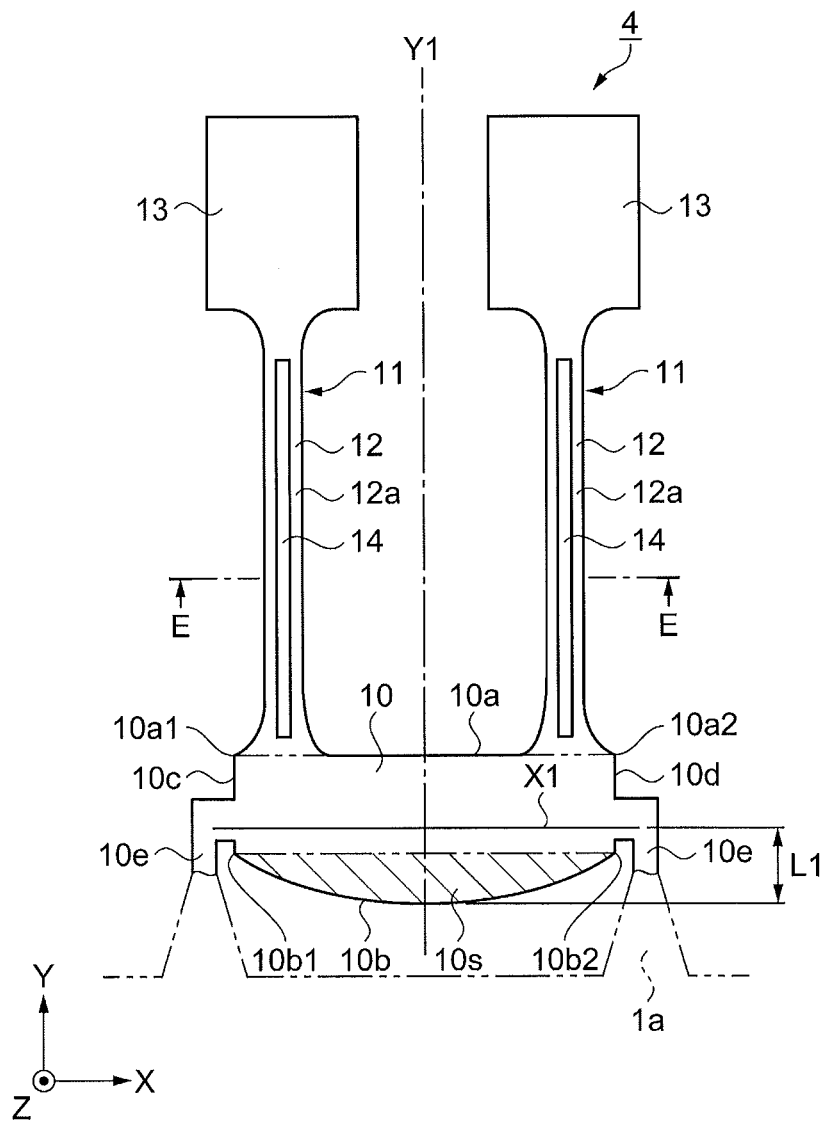
Figure 4B:
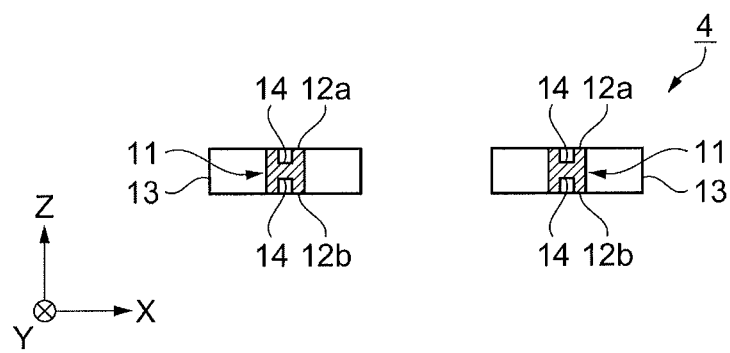

FIGS. 4A and 4B are schematic diagrams illustrating a schematic configuration of a quartz crystal resonator element of Modification Example 3 of the first embodiment. FIG. 4A is a schematic plan view, and FIG. 4B is a schematic cross-sectional view taken along the line E-E of FIG. 4A. In addition, like elements as those of the first embodiment are denoted by like reference numerals, and the detailed description thereof will be omitted. In addition, different parts from those of the first embodiment will be mainly described.

As illustrated in FIGS. 4A and 4B, a quartz crystal resonator element 4 of Modification Example 3 is different from the first embodiment in the configuration of the protrusion 10e of the base portion 10.

In the quartz crystal resonator element 4, the protrusions 10e have shapes that protrude from the third end portion 10c and the fourth end portion 10d of the base portion 10 respectively in the −X direction and the +X direction and are bent to extend in the −Y direction so that the tip ends thereof are separated from the parent material 1a.

In addition, the tip ends of the protrusions 10e are positioned closer to the +Y side than the point of intersection of the second end portion 10b of the base portion 10 with the Y-axis direction reference line Y1.

As described above, in the quartz crystal resonator element 4, since the protrusions 10e have shapes that are bent to extend in the −Y direction so that the tip ends thereof are separated from the parent material 1a, folding from the parent material 1a can be easily performed by folding and bending the whole body of the quartz crystal resonator element 4 in the Z-axis direction using both the protrusions 10e as the fulcrums. In addition, the configuration of the protrusion 10e of Modification Example 3 can also be applied to each of the above modification examples and a modification example described below. Particularly, in the case where the thin portion 10e1 is provided as in the protrusion 10e of Modification Example 1, the thin portion 10e1 is preferably provided in a region where the protrusion 10e is bent in the −Y direction and extends in the −Y direction. In this case, in the quartz crystal resonator element 4, the strength of the protrusion 10e is partially reduced, separation from the parent material 1a by folding becomes easier, and the base portion 10 can be prevented from being broken.

In addition, in this case, in the quartz crystal resonator element 4, it is natural that the thin portion 10e1 may be formed by providing the grooves on both sides of the protrusion 10e in the Z-axis direction as in Modification Example 1 or may also be formed by providing the groove on any one of the sides of the protrusion 10e.

Modification Example 4

Figure 5A:
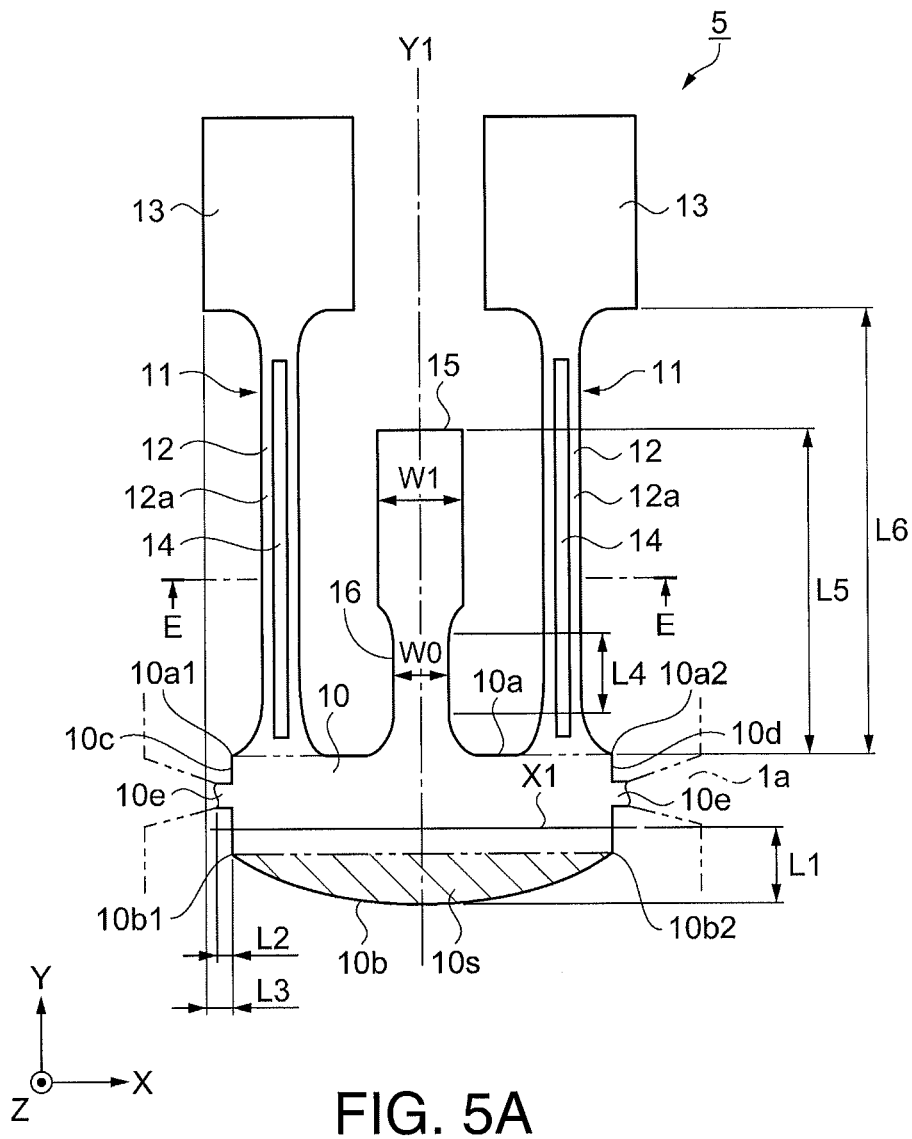
Figure 5B:
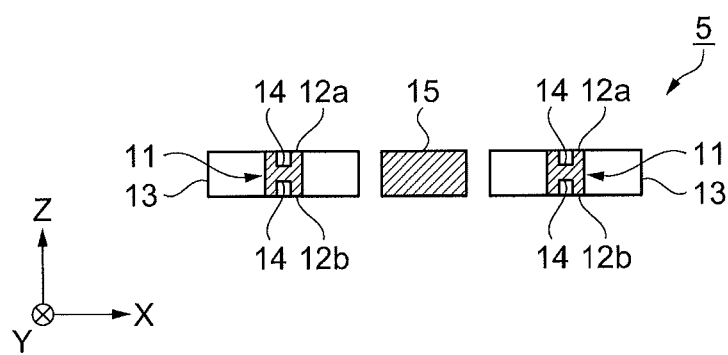

FIGS. 5A and 5B are schematic diagrams illustrating a schematic configuration of a quartz crystal resonator element of Modification Example 4 of the first embodiment. FIG. 5A is a schematic plan view, and FIG. 5B is a schematic cross-sectional view taken along the line E-E of FIG. 5A. In addition, like elements as those of the first embodiment are denoted by like reference numerals, and the detailed description thereof will be omitted. In addition, different parts from those of the first embodiment will be mainly described.

As illustrated in FIGS. 5A and 5B, in a quartz crystal resonator element 5 of Modification Example 4, a holding portion 15 having an arm shape that extends from the first end portion 10a of the base portion 10 between the pair of vibrating arms 11 on the Y-axis direction reference line Y1 along the Y-axis direction is provided.

In addition, a narrow portion 16 is preferably formed at the root of the holding portion 15.

In the quartz crystal resonator element 5, when it is assumed that the width (length in the X-axis direction) of the narrow portion 16 is W0, the width of the holding portion 15 is W1, the length (length in the Y-axis direction) of the narrow portion 16 is L4, the length of the holding portion 15 is L5, and the length of the arm portion 12 is L6, the relationships of $0<W0/W1\leq 0.5$, $0.1<L4/L6\leq 0.9$, and $L5<L6$ are preferably satisfied.

In the quartz crystal resonator element 5, a fixing portion for the connection to the package is provided in at least one surface of front and rear principal surfaces of a predetermined region (a region of the holding portion 15 which is positioned closer to the tip end side than the narrow portion 16) of the holding portion 15 excluding the narrow portion 16.

In the quartz crystal resonator element 5, since the above relationships are satisfied, from the flexural vibration frequency f in a flexural opposite-phase mode in which the pair of vibrating arms 11 undergo flexural vibration by alternately repeating separating and approaching, the flexural vibration frequency f1 in a flexural same-phase mode in which the pair of vibrating arms 11 have the main displacements in the same X-axis direction and undergo flexural vibration by allowing the main displaces to be alternately repeated in the +X direction and the −X direction, can be separated to be on a sufficiently low frequency side.

Accordingly, in the quartz crystal resonator element 5, the flexural opposite-phase mode which is the original flexural vibration mode is suppressed from being strongly combined with the unnecessary flexural same-phase mode, and thus vibration leakage in the flexural opposite-phase mode can be sufficiently reduced.

As described above, in the quartz crystal resonator element 5, since the holding portion 15 having the arm shape that extends from the first end portion 10a of the base portion 10 between the pair of vibrating arms 11 along the Y-axis direction is provided, compared to a case where the holding portion 15 is absent, for example, fixing to an external member such as the package can be easily performed via the holding portion 15.

In addition, the configuration of the holding portion 15 of Modification Example 4 can be applied to each of the modification examples described above.

Second Embodiment

Next, a quartz crystal resonator element of a second embodiment will be described.

Figure 6A:
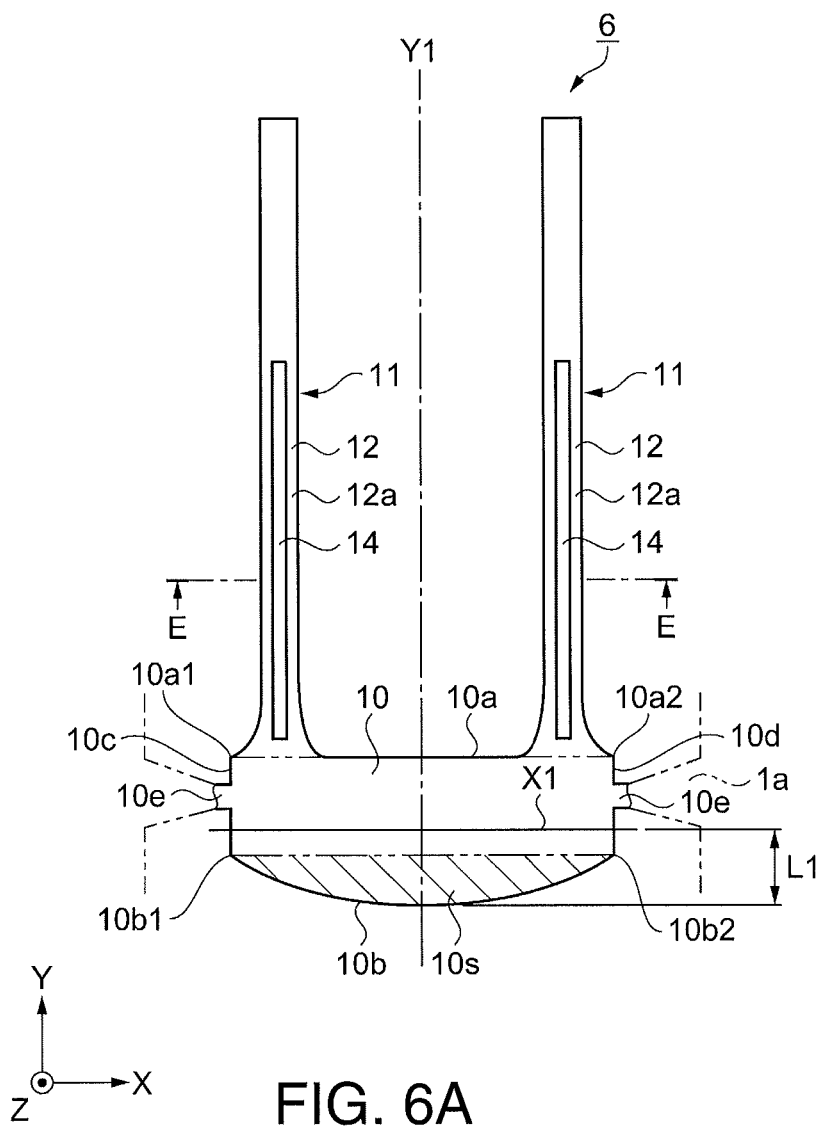
Figure 6B:
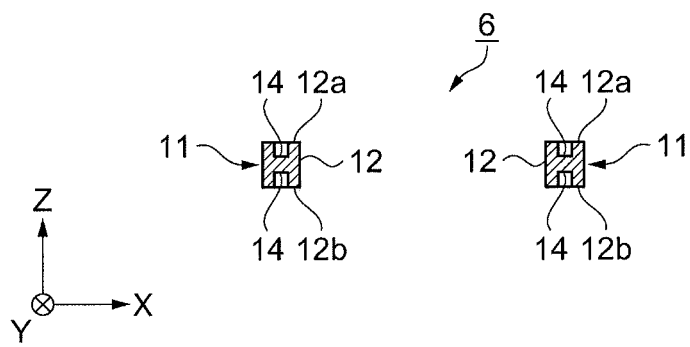

FIGS. 6A and 6B are schematic diagrams illustrating a schematic configuration of the quartz crystal resonator element of the second embodiment. FIG. 6A is a schematic plan view, and FIG. 6B is a schematic cross-sectional view taken along the line E-E of FIG. 6A. In addition, like elements as those of the first embodiment are denoted by like reference numerals, and the detailed description thereof will be omitted. In addition, different parts from those of the first embodiment will be mainly described.

As illustrated in FIGS. 6A and 6B, the quartz crystal resonator element 6 of the second embodiment is different from the first embodiment in the configuration of the pair of vibrating arms 11.

The quartz crystal resonator element 6 is configured to include the arm portions 12 in the pair of vibrating arms 11 without the mass portions 13 (see FIGS. 1A and 1B) as in the first embodiment.

Accordingly, in the quartz crystal resonator element 6, since the mass portions 13 that have greater widths along the X-axis direction than the arm portions 12 are not provided in the pair of vibrating arms 11, the interval between the pair of vibrating arms 11 can be reduced to be smaller than that of the first embodiment.

As a result, the size of the quartz crystal resonator element 6 in the X-axis direction can be reduced compared to the first embodiment.

Next, modification examples of the second embodiment will be described.

Modification Example 1

Figure 7A:
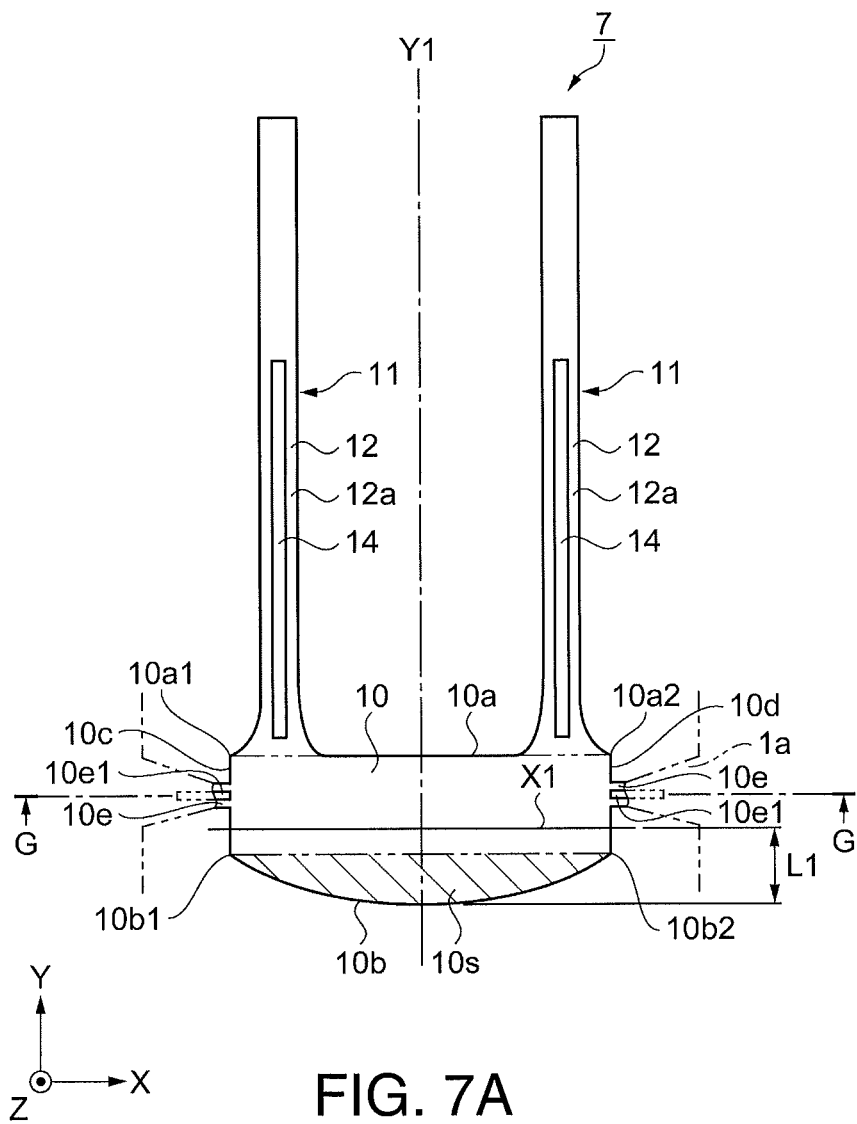
Figure 7B:
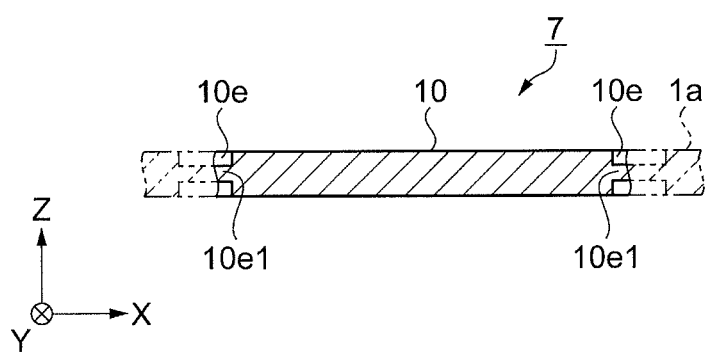

FIGS. 7A and 7B are schematic diagrams illustrating a schematic configuration of a quartz crystal resonator element of Modification Example 1 of the second embodiment. FIG. 7A is a schematic plan view, and FIG. 7B is a schematic cross-sectional view taken along the line G-G of FIG. 7A. In addition, like elements as those of the second embodiment are denoted by like reference numerals, and the detailed description thereof will be omitted. In addition, different parts from those of the second embodiment will be mainly described.

As illustrated in FIGS. 7A and 7B, a quartz crystal resonator element 7 of Modification Example 1 is different from the second embodiment in the configuration of the protrusion 10e of the base portion 10.

In the quartz crystal resonator element 7, the protrusion 10e includes a thin portion 10e1 as a part thinner than the base portion 10 in the Z-axis direction as a third direction perpendicular to the Y-axis direction and the X-axis direction. In addition, the thin portion 10e1 interposed between bottomed grooves extending along the X-axis direction can be formed together when the groove portions 14 of the pair of vibrating arms 11 are formed by etching.

As described above, in the quartz crystal resonator element 7 of Modification Example 1, since the protrusion 10e includes the thin portion 10e1 thinner than the base portion 10 in the Z-axis direction perpendicular to the Y-axis direction and the X-axis direction, the strength of the protrusion 10e is partially reduced, thus separation thereof from the parent material 1a by folding becomes easier than the second embodiment.

In addition, in FIGS. 7A and 7B, the thin portion 10e1 is formed by providing grooves on both sides of the protrusion 10e in the Z-axis direction, but may also be formed by providing a groove on any one of the sides. In this case, in the quartz crystal resonator element 7, the surface on the other side of the protrusion 10e remains flat. Therefore, a pair of connection electrodes (not illustrated) which are electrically connected to the parent material 1a from the pair of terminal electrodes (not illustrated) of the base portion 10 can be easily formed at the surface on the other side of the protrusion 10e.

In addition, the groove may not be formed over the entire region of the protrusion 10e in the X-axis direction but may be partially formed. Otherwise, the groove may also be formed over the entire region as illustrated in FIGS. 7A and 7B. Furthermore, the groove may also have a shape extending along the Y-axis direction.

In addition, the configuration of the protrusion 10e of Modification Example 1 can also be applied to each of modification examples described below.

Modification Example 2

Figure 8A:
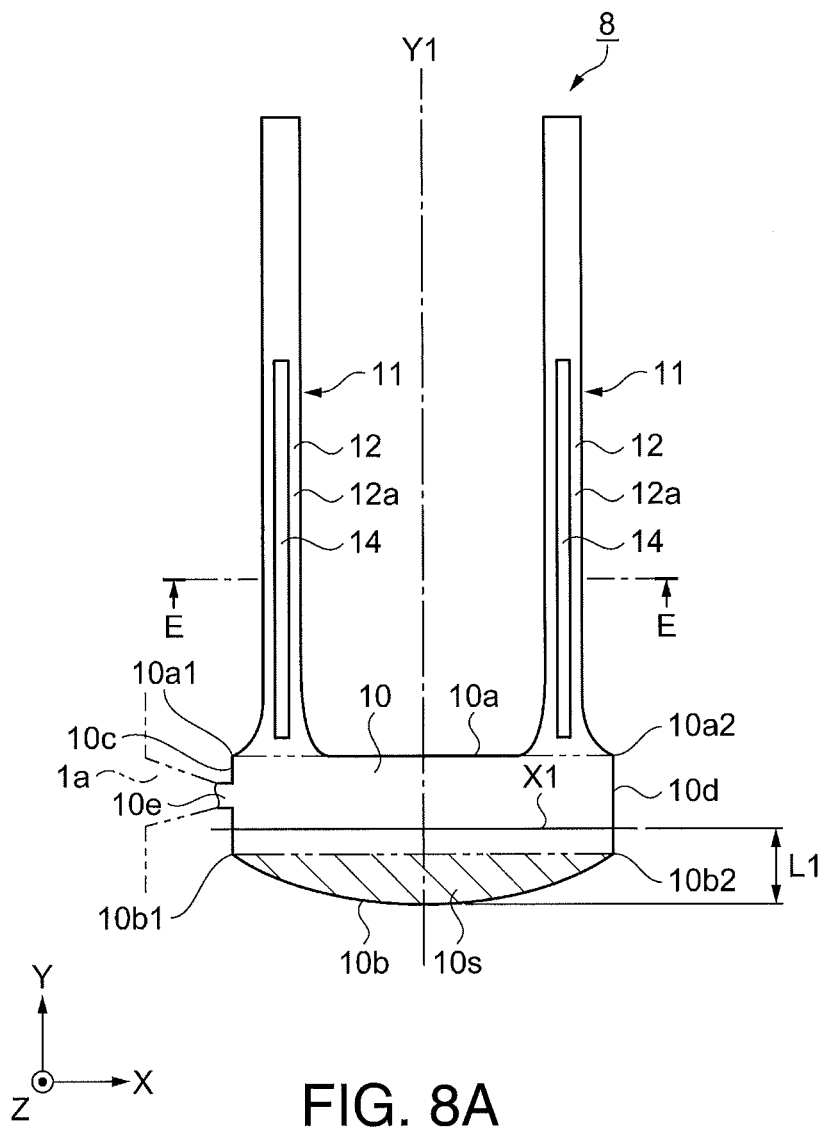
Figure 8B:
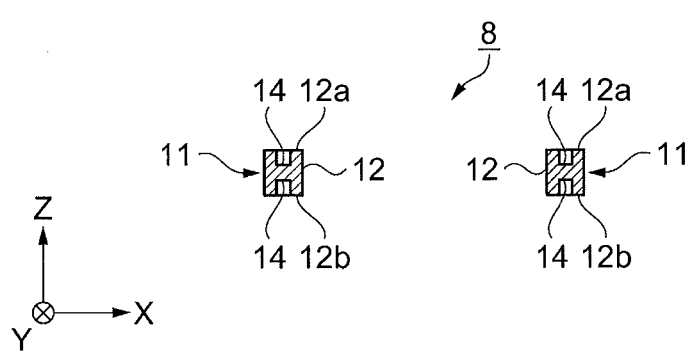

FIGS. 8A and 8B are schematic diagrams illustrating a schematic configuration of a quartz crystal resonator element of Modification Example 2 of the second embodiment. FIG. 8A is a schematic plan view, and FIG. 8B is a schematic cross-sectional view taken along the line E-E of FIG. 8A. In addition, like elements as those of the second embodiment are denoted by like reference numerals, and the detailed description thereof will be omitted. In addition, different parts from those of the second embodiment will be mainly described.

As illustrated in FIGS. 8A and 8B, a quartz crystal resonator element 8 of Modification Example 2 is different from the second embodiment in the configuration of the protrusion 10e of the base portion 10.

In the quartz crystal resonator element 8, the protrusion 10e is provided in one (here, the third end portion 10c) of the third end portion 10c and the fourth end portion 10d of the base portion 10.

As described above, in the quartz crystal resonator element 8, since the protrusion 10e is provided in one of the third end portion 10c and the fourth end portion 10d of the base portion 10, a point of separation from the parent material 1a is one, and thus separation (folding) from the parent material 1a becomes easier than the case where the protrusions 10e are provided in both the third end portion 10c and the fourth end portion 10d.

In addition, the configuration of the protrusion 10e of Modification Example 2 can also be applied to the above modification example and each of modification examples described below.

Modification Example 3

Figure 9A:
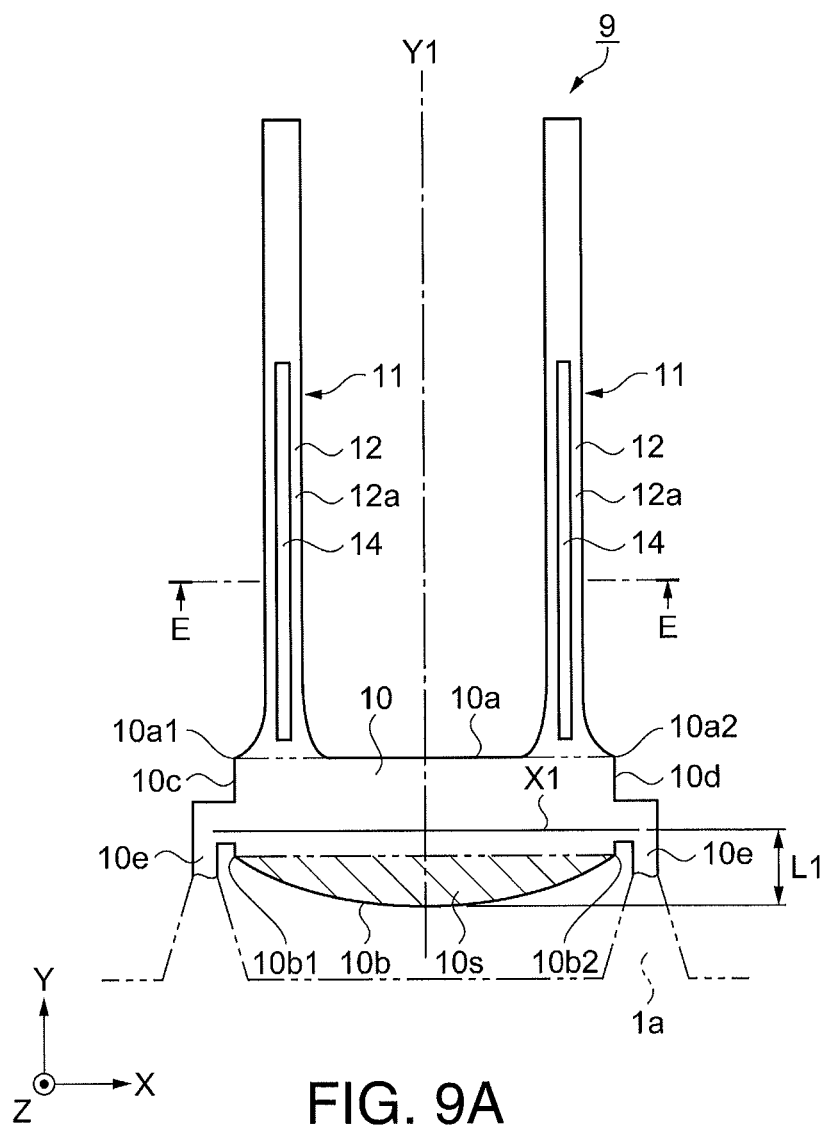
Figure 9B:
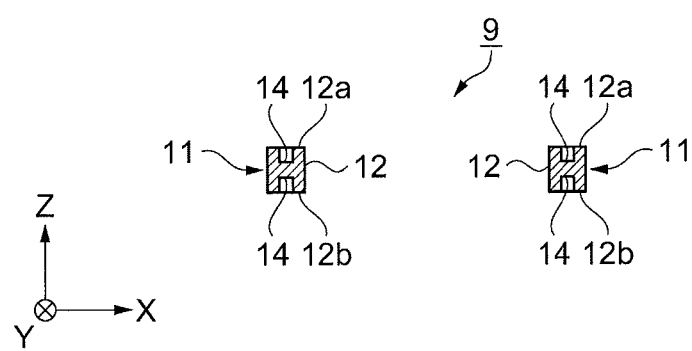

FIGS. 9A and 9B are schematic diagrams illustrating a schematic configuration of a quartz crystal resonator element of Modification Example 3 of the second embodiment. FIG. 9A is a schematic plan view, and FIG. 9B is a schematic cross-sectional view taken along the line E-E of FIG. 9A. In addition, like elements as those of the second embodiment are denoted by like reference numerals, and the detailed description thereof will be omitted. In addition, different parts from those of the second embodiment will be mainly described.

As illustrated in FIGS. 9A and 9B, a quartz crystal resonator element 9 of Modification Example 3 is different from the second embodiment in the configuration of the protrusion 10e of the base portion 10.

In the quartz crystal resonator element 9, the protrusions 10e have shapes that protrude from the third end portion 10c and the fourth end portion 10d of the base portion 10 respectively in the −X direction and the +X direction and are bent to extend in the −Y direction so that the tip ends thereof are separated from the parent material 1a.

In addition, the tip ends of the protrusions 10e are positioned closer to the +Y side than the point of intersection of the second end portion 10b of the base portion 10 with the Y-axis direction reference line Y1.

As described above, in the quartz crystal resonator element 9, since the protrusions 10e have shapes that are bent to extend in the −Y direction so that the tip ends thereof are separated from the parent material 1a, folding from the parent material 1a can be easily performed by folding and bending the whole body of the quartz crystal resonator element 9 in the Z-axis direction using both the protrusions 10e as the fulcrums. In addition, the configuration of the protrusion 10e of Modification Example 3 can also be applied to each of the above modification examples and a modification example described below. Particularly, in the case where the thin portion 10e1 is provided as in the protrusion 10e of Modification Example 1, since the protrusion 10e is bent in the −Y direction, the thin portion 10e1 is preferably provided in a region that extends in the −Y direction.

In this case, in the quartz crystal resonator element 9, the strength of the protrusion 10e is partially reduced, separation from the parent material 1a by folding becomes easier, and the base portion 10 can be prevented from being broken. In addition, in this case, in the quartz crystal resonator element 9, it is natural that the thin portion 10e1 may be formed by providing the grooves on both sides of the protrusion 10e in the Z-axis direction as in Modification Example 1 or may also be formed by providing the groove on any one of the sides of the protrusion 10e.

Modification Example 4

Figure 10A:
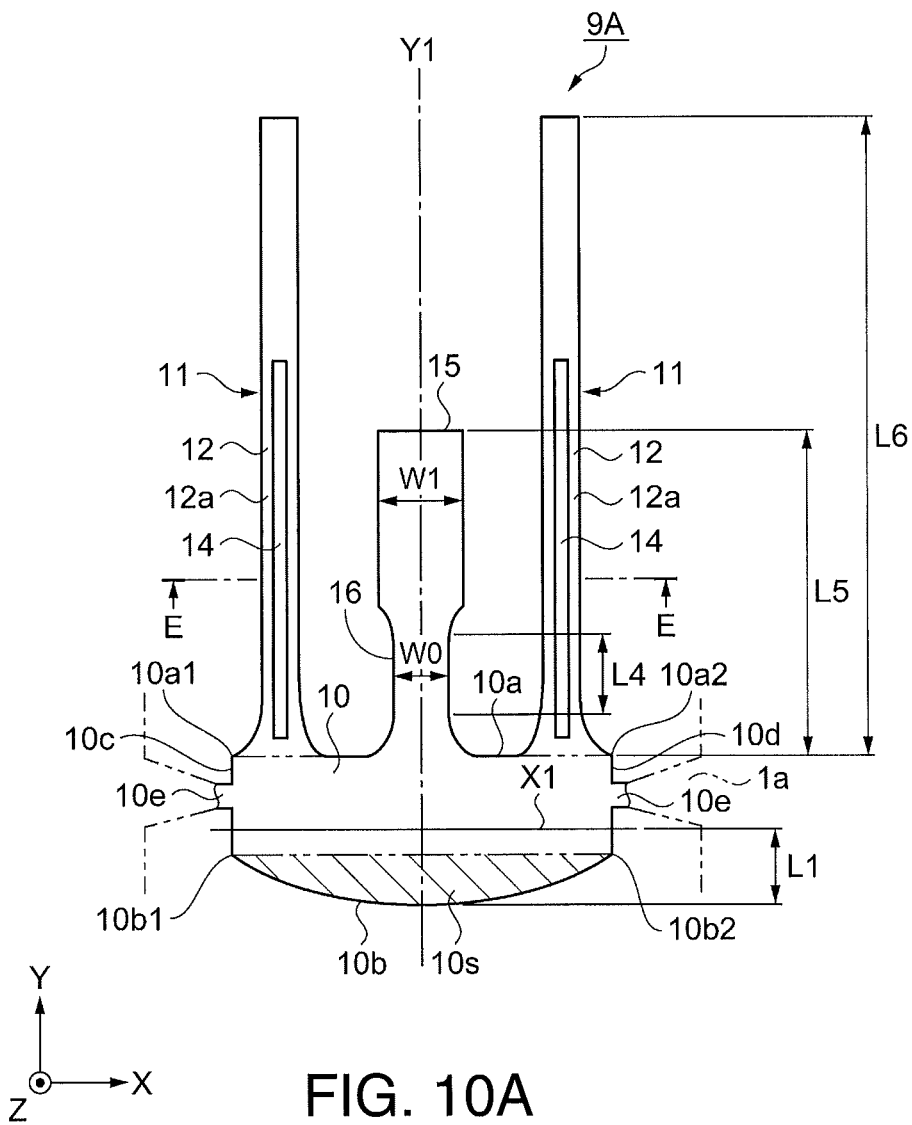
Figure 10B:
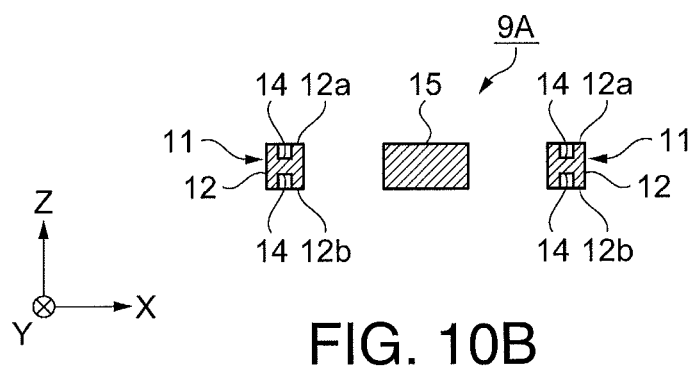

FIGS. 10A and 10B are schematic diagrams illustrating a schematic configuration of a quartz crystal resonator element of Modification Example 4 of the second embodiment. FIG. 10A is a schematic plan view, and FIG. 10B is a schematic cross-sectional view taken along the line E-E of FIG. 10A. In addition, like elements as those of the second embodiment are denoted by like reference numerals, and the detailed description thereof will be omitted. In addition, different parts from those of the second embodiment will be mainly described.

As illustrated in FIGS. 10A and 10B, in a quartz crystal resonator element 9A of Modification Example 4, a holding portion 15 having an arm shape that extends from the first end portion 10a of the base portion 10 between the pair of vibrating arms 11 on the Y-axis direction reference line Y1 along the Y-axis direction is provided.

In addition, a narrow portion 16 that suppresses the propagation of vibration from the base portion 10 is preferably formed at the root of the holding portion 15.

In the quartz crystal resonator element 9A, when it is assumed that the width (length in the X-axis direction) of the narrow portion 16 is W0, the width of the holding portion 15 is W1, the length (length in the Y-axis direction) of the narrow portion 16 is L4, the length of the holding portion 15 is L5, and the length of the arm portion 12 is L6, the relationships of $0<W0/W1\leq 0.5$, $0.1<L4/L6\leq 0.9$, and $L5<L6$ are preferably satisfied.

In the quartz crystal resonator element 9A, a fixing portion for the connection to the package is provided in at least one surface of front and rear principal surfaces of a predetermined region (a region of the holding portion 15 which is positioned closer to the tip end side than the narrow portion 16) of the holding portion 15 excluding the narrow portion 16.

In the quartz crystal resonator element 9A, since the above relationships are satisfied, from the flexural vibration frequency f in a flexural opposite-phase mode in which the pair of vibrating arms 11 undergo flexural vibration by alternately repeating separating and approaching, the flexural vibration frequency f1 in a flexural same-phase mode in which the pair of vibrating arms 11 have the main displacements in the same X-axis direction and undergo flexural vibration by allowing the main displaces to be alternately repeated in the +X-axis direction and the −X-axis direction, can be separated to be on a sufficiently low frequency side.

Accordingly, in the quartz crystal resonator element 9A, the flexural opposite-phase mode which is the original flexural vibration mode is suppressed from being strongly combined with the unnecessary flexural same-phase mode, and thus vibration leakage in the flexural opposite-phase mode can be sufficiently reduced.

As described above, in the quartz crystal resonator element 9A, since the holding portion 15 having the arm shape that extends from the first end portion 10a of the base portion 10 between the pair of vibrating arms 11 along the Y-axis direction is provided, compared to a case where the holding portion 15 is absent, for example, fixing to an external member such as the package can be easily performed via the holding portion 15.

In addition, the configuration of the holding portion 15 of Modification Example 4 can be applied to each of the modification examples described above.

Third Embodiment

Next, a quartz crystal resonator will be described as an example of a resonator which includes the above-described resonator element and a container which accommodates the resonator element.

Figure 11A:
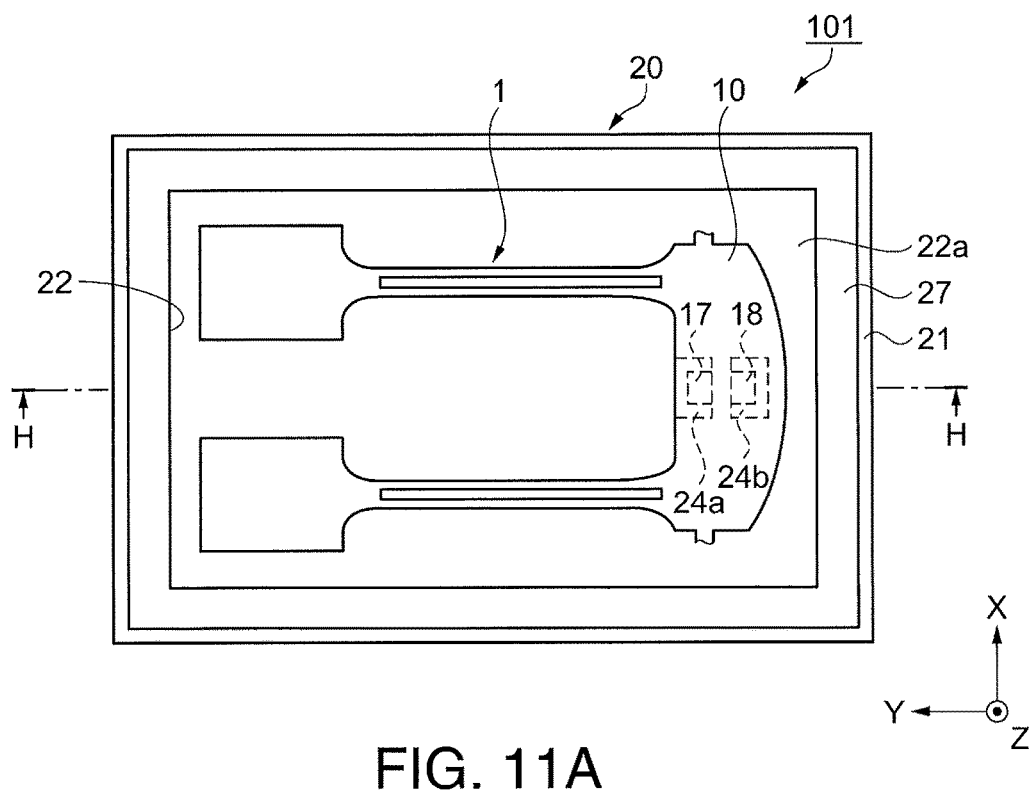
Figure 11B:
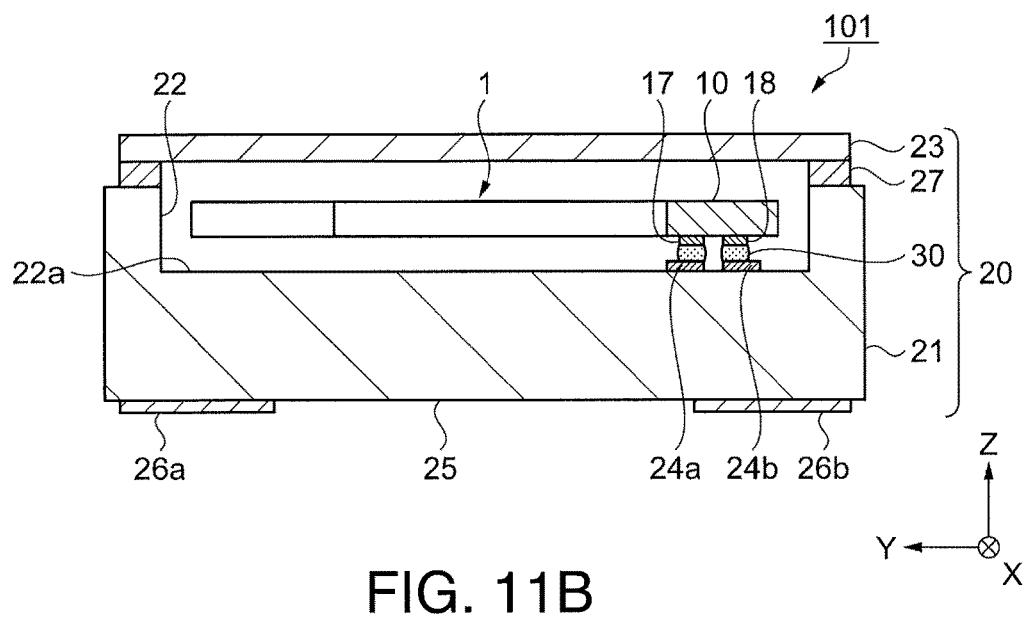

FIGS. 11A and 11B are schematic diagrams illustrating a schematic configuration of the quartz crystal resonator of the third embodiment. FIG. 11A is a schematic plan view viewed from a lid side, and FIG. 11B is a schematic cross-sectional view taken along the line H-H of FIG. 11A. In addition, in the plan view, the lid is omitted. In addition, like elements as those of the above-described embodiments are denoted by like reference numerals, and the detailed description thereof will be omitted. In addition, different parts from those of the above-described embodiments will be mainly described.

As illustrated in FIGS. 11A and 11B, the quartz crystal resonator 101 includes any (here, the quartz crystal resonator element 1) of the quartz crystal resonator elements (1 to 9 and 9A) as the resonator elements described in the embodiments and the modification examples and a package 20 as the container which accommodates the quartz crystal resonator element 1. The package 20 includes a package base 21 provided with a recessed portion 22 having a substantially rectangular flat surface shape and the lid (cover body) 23 having a flat plate shape which covers the recessed portion 22 of the package base 21, and is formed in a substantially cuboid shape.

For the package base 21, a ceramic-based insulating material obtained by molding, laminating, and sintering ceramic green sheets, such as an aluminum oxide sintered body, a mullite sintered body, an aluminum nitride sintered body, a silicon carbide sintered body, or a glass ceramic sintered body, quartz crystal, glass, silicon (high-resistance silicon), or the like is used.

For the lid 23, the same material as the package base 21 or a metal such as Kovar or 42 Alloy is used.

In an inner bottom surface 22a (the bottom surface of the inside) of the recessed portion 22 of the package base 21, internal terminals 24a and 24b are provided at positions opposing mount electrodes 17 and 18 as the terminal electrodes drawn from the excitation electrodes (not illustrated) of the quartz crystal resonator element 1 to the base portion 10. In the quartz crystal resonator element 1, the mount electrodes 17 and 18 are joined to the internal terminals 24a and 24b via conductive joining members 30 using an epoxy-based, silicone-based, polyimide-based, acrylic, or bismaleimide-based conductive adhesive in which a conductive material such as a metal filler is mixed, a metal bump such as Au (gold), Al (aluminum), or a solder bump, a metal layer (for example, refer to JP-A-2007-324523), a resin bump in which metal wiring is formed on a core made of a resin, or the like. In addition, as an example of a joining method, a metal paste made of one or more types of metal powder selected from gold powder, silver powder, platinum powder, and palladium powder having a purity of 99.9 weight % or greater and an average particle size of 0.005 µm to 1.0 µm and an organic solvent is applied to the base portion 10. Subsequently, the metal paste is dried and is sintered at a temperature of 80° C. to 300° C. to form a metal powder sintered body. In addition, the base portion 10 and the internal terminals 24a and 24b of the inner bottom surface 22a of the recessed portion 22 of the package base 21 are arranged via the metal powder sintered body, and are joined by being pressurized in one direction or in both directions while at least the metal powder sintered body is heated.

The configurations and the materials of the excitation electrodes of the quartz crystal resonator element 1 and the mount electrodes 17 and 18 are not particularly limited. However, for example, it is preferable that the electrodes be configured as a metal film having a configuration in which Cr (chromium) or Ni (nickel) is a base layer and Au (gold) or Ag (silver) is laminated thereon, and a thickness t0 of the base layer is $0<t0\leq 70$ nm, a thickness t1 of Au or Ag laminated thereon is $0\leq t1\leq 70$ nm. More preferably, the thicknesses satisfy $0<t0\leq 10$ nm and $0\leq t1\leq 10$ nm. Accordingly, the quartz crystal resonator element 1 in which thermoelastic loss is small, thermal stress which occurs at the interface between the mount electrodes 17 and 18 and the quartz crystal resonator element 1 is small, and long-term reliability is excellent can be obtained.

Rectangular electrode terminals 26a and 26b are provided in an outer bottom surface 25 (bottom surface of the outside) on the opposite side to the recessed portion 22 of the package base 21.

The electrode terminals 26a and 26b are electrically connected to the internal terminals 24a and 24b by inner wiring (not illustrated). Specifically, the electrode terminal 26a is electrically connected to the internal terminal 24a, and the electrode terminal 26b is electrically connected to the internal terminal 24b.

In addition, the internal terminals 24a and 24b and the electrode terminals 26a and 26b are made from a metal film having a configuration in which films made of Ni (nickel), Au (gold), and the like are laminated on a metallized layer made of W (tungsten), Mo (molybdenum), or the like by plating. In the quartz crystal resonator 101, in a state where the quartz crystal resonator element 1 is joined to the internal terminals 24a and 24b of the package base 21, the recessed portion 22 of the package base 21 is covered by the lid 23 and the package base 21 and the lid 23 are joined by a joining member 27 such as a seam ring, low melting point glass, or an adhesive such that the recessed portion 22 of the package base 21 is airtightly sealed.

In addition, the inside of the airtightly sealed recessed portion 22 of the package base 21 is in a decompressed vacuum state (a state where the degree of vacuum is high) so that the flexural vibration of the quartz crystal resonator element 1 is not impeded.

In addition, the package 20 may also be configured to include a package base 21 having a flat plate shape and a lid 23 including a recessed portion. Otherwise, the package 20 may also include recessed portions in both the package base 21 and the lid 23. In the quartz crystal resonator 101, by a drive signal applied from, for example, an oscillation circuit integrated into an IC chip of an electronic device via the electrode terminals 26a and 26b, the quartz crystal resonator element 1 is excited to undergo the flexural vibration and resonates (oscillates) at a predetermined frequency, and a resonance signal (oscillation signal) is output from the electrode terminals 26a and 26b.

As described above, since the quartz crystal resonator 101 of the third embodiment includes the quartz crystal resonator element 1 and the package 20 which accommodates the quartz crystal resonator element 1, the quartz crystal resonator as the resonator which reflects the effect described in the first embodiment can be provided. Specifically, the quartz crystal resonator having low vibration leakage and excellent frequency characteristics with a small size can be provided.

In addition, even when the quartz crystal resonator 101 uses the other quartz crystal resonator elements (2 and the like) described above instead of the quartz crystal resonator element 1, the quartz crystal resonator which reflects the above effect and the specific effects of the other quartz crystal resonator elements (2 and the like) can be provided.

In addition, in the quartz crystal resonator 101, electrical connection between the mount electrodes 17 and 18 and the internal terminals 24a and 24b may be made by wire bonding using a metal wire. In this case, the positions of the mount electrodes 17 and 18 and the internal terminals 24a and 24b are appropriately set.

In addition, in the quartz crystal resonator 101, the protrusion 10e provided in the base portion 10 of the quartz crystal resonator element 1 functions as an alignment marker (positioning portion) when being mounted in the package base 21, and thus can control the mounting position of the quartz crystal resonator element 1 with high accuracy.

Fourth Embodiment

Next, a quartz crystal oscillator will be described as an example of an oscillator which includes the above-described resonator element and an oscillation circuit that causes the resonator element to oscillate.

Figure 12A:
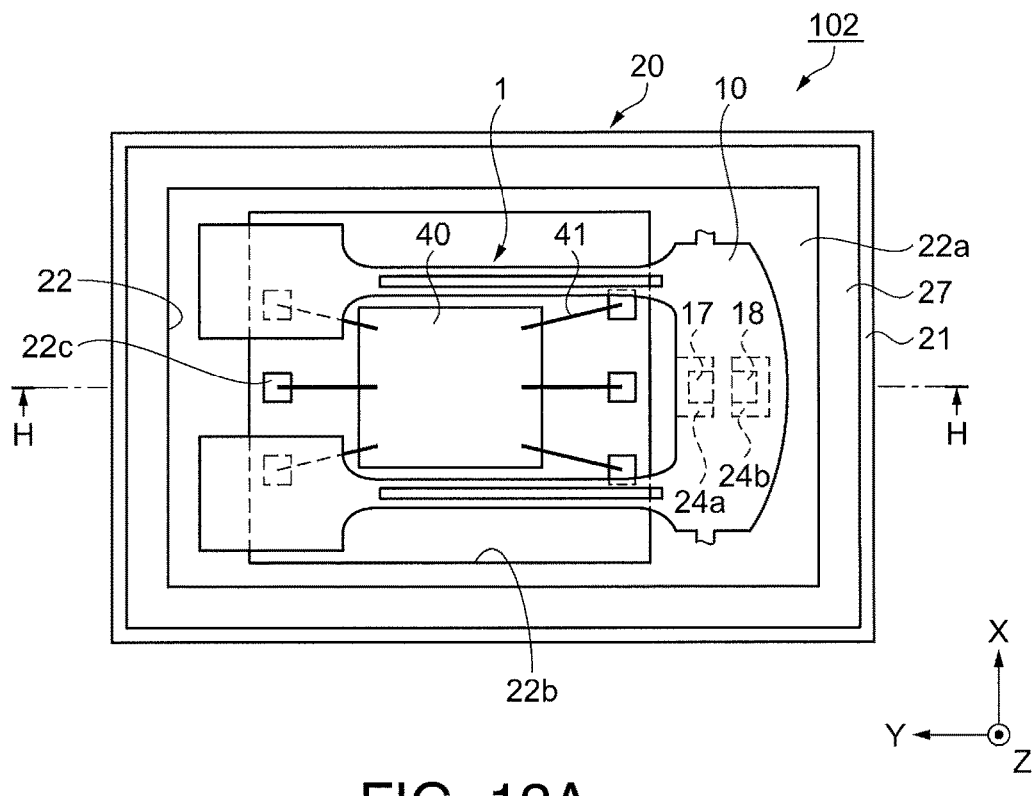
Figure 12B:
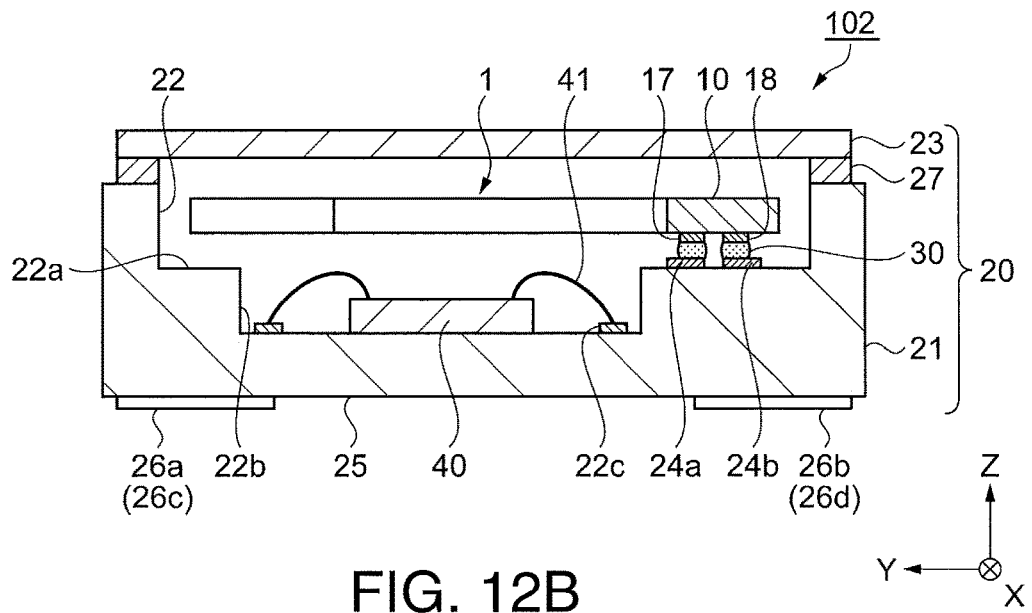

FIGS. 12A and 12B are schematic diagrams illustrating a schematic configuration of the quartz crystal oscillator of the fourth embodiment. FIG. 12A is a schematic plan view viewed from a lid side, and FIG. 12B is a schematic cross-sectional view taken along the line H-H of FIG. 12A. In addition, in the plan view, the lid is omitted. In addition, like elements as those of the above-described embodiments are denoted by like reference numerals, and the detailed description thereof will be omitted. In addition, different parts from those of the above-described embodiments will be mainly described.

As illustrated in FIGS. 12A and 12B, the quartz crystal oscillator 102 includes any (here, the quartz crystal resonator element 1) of the quartz crystal resonator elements (1 to 9 and 9A) as the resonator elements described in the embodiments and the modification examples, an IC chip 40 as the oscillation circuit that causes the quartz crystal resonator element 1 to oscillate (drive), and the package 20 which accommodates the quartz crystal resonator element 1 and the IC chip 40. An accommodating portion 22b of the IC chip 40 which is formed in a recessed shape is provided in the inner bottom surface 22a of the recessed portion 22 of the package base 21. The IC chip 40 having the oscillation circuit embedded therein is fixed to a bottom surface of the accommodating portion 22b of the package base 21 using an adhesive (not illustrated). In the IC chip 40, a connection pad (not illustrated) is electrically connected to an internal connection terminal 22c inside the accommodating portion 22b by a metal wire 41 made of Au (gold), Al (aluminum), or the like.

The internal connection terminal 22c is made from a metal film in which films made of Ni (nickel), Au (gold), and the like are laminated by plating on a metallized layer made of W (tungsten), Mo (molybdenum), or the like, and is electrically connected to the electrode terminals 26a, 26b, 26c, and 26d provided at four corners of the outer bottom surface 25 of the package 20, the internal terminals 24a and 24b, and the like via inner wiring (not illustrated).

In addition, for connection between the connection pad of the IC chip 40 and the internal connection terminal 22c, in addition to a connection method by wire bonding using the metal wire 41, a connection method using flip chip mounting by reversing the IC chip 40, or the like may be used.

In addition, the IC chip 40 may also be configured to be mounted inside a recessed portion provided in the outer bottom surface 25 of the package 20 and sealed by a mold material.

In the quartz crystal oscillator 102, the quartz crystal resonator element 1 is excited to undergo the flexural vibration and resonates (oscillates) at a predetermined frequency by the drive signal applied from the IC chip 40 via the internal connection terminal 22c, the internal terminals 24a and 24b, and the like.

In addition, in the quartz crystal oscillator 102, the oscillation signal generated by the oscillation is output to the outside via the IC chip 40, the electrode terminals 26a and 26b (26c and 26d), and the like.

As described above, since the quartz crystal oscillator 102 of the fourth embodiment includes the quartz crystal resonator element 1, the IC chip 40 that causes the quartz crystal resonator element 1 to oscillate, and the package 20 which accommodates the quartz crystal resonator element 1 and the IC chip 40, the quartz crystal oscillator as the oscillator which reflects the effect described in the first embodiment can be provided. Specifically, the quartz crystal oscillator having low vibration leakage and excellent frequency characteristics with a small size can be provided.

In addition, even when the quartz crystal oscillator 102 uses the other quartz crystal resonator elements (2 and the like) described above instead of the quartz crystal resonator element 1, the quartz crystal oscillator which reflects the above effect and the specific effects of the other quartz crystal resonator elements (2 and the like) can be provided.

In addition, the quartz crystal oscillator 102 may have a module structure (for example, a structure in which the quartz crystal resonator (101) and the IC chip (40) are individually mounted on a single substrate) having a configuration in which the IC chip 40 is not embedded in the package 20 but is attached to the outside thereof.

Fifth Embodiment

Next, a mobile phone will be described as an example of an electronic device provided with the above-described resonator element.

Figure 13:
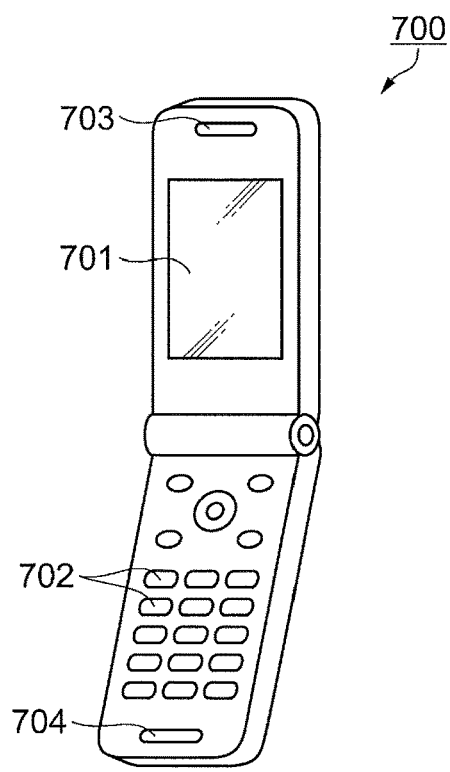
FIG. 13 is a schematic perspective view illustrating a mobile phone of a fifth embodiment.

FIG. 13 is a schematic perspective view illustrating the mobile phone of the fifth embodiment.

The mobile phone 700 is a mobile phone provided with any of the quartz crystal resonator elements (1 to 9 and 9A) as the resonator elements described in the embodiments and the modification examples.

The mobile phone 700 illustrated in FIG. 13 is configured to use the above-described quartz crystal resonator element (1 or the like) as, for example, a component of a timing device such as a reference clock oscillation source and further include a liquid crystal display 701, a plurality of operation buttons 702, an earpiece 703, and a mouthpiece 704.

Accordingly, since the mobile phone 700 includes the quartz crystal resonator element (1 or the like), the effects described in the embodiments and the modification examples are reflected, and thus excellent performance can be exhibited. In addition, the form of the mobile phone 700 is not limited to the illustrated type and may be a so-called smartphone type. The quartz crystal resonator element described above is not limited to a mobile phone such as the mobile phone 700, and can be appropriately used as a component of a timing device of an electronic book, a personal computer, a television, a digital still camera, a video camera, a video recorder, a navigation device, a pager, an electronic organizer, a calculator, a word processor, a workstation, a videophone, a POS terminal, a device provided with a touch panel, and the like. In any case, the excellent electronic device which reflects the effects described in the embodiments and the modification examples can be provided.

Sixth Embodiment

Figure 14:
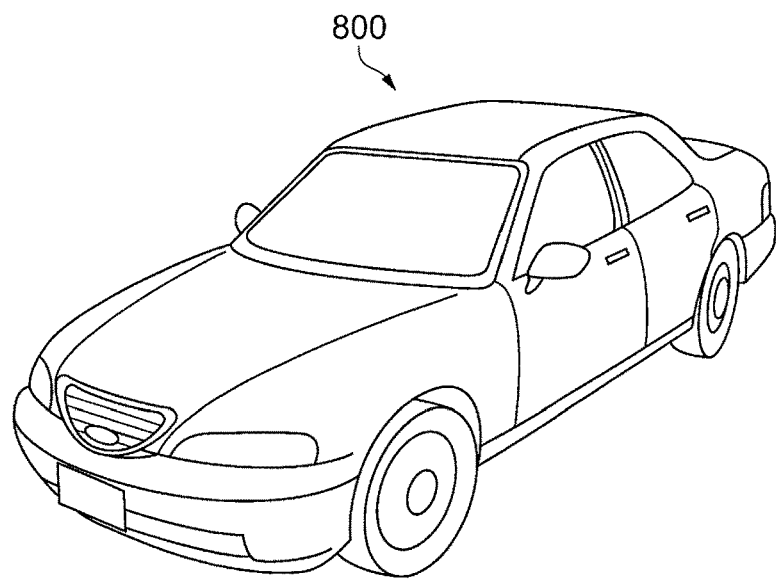
FIG. 14 is a schematic perspective view illustrating a vehicle of a sixth embodiment.

Next, a vehicle will be described as an example of a moving object provided with the above-described resonator element. FIG. 14 is a schematic perspective view illustrating the vehicle of the sixth embodiment.

The vehicle 800 is a vehicle provided with any of the quartz crystal resonator elements (1 to 9 and 9A) as the resonator element described in the embodiments and the modification examples.

The vehicle 800 uses the above-described quartz crystal resonator element (1 or the like) as a component of a timing device which generates a reference clock of various electronic control type devices (for example, an electronic control type fuel injector, an electronic control type ABS device, an electronic control type constant speed travel device, and the like) mounted therein.

Accordingly, since the vehicle 800 includes the quartz crystal resonator element (1 or the like), the effects described in the embodiments and the modification examples are reflected, and thus excellent performance can be exhibited.

The quartz crystal resonator element described above is not limited to the vehicle 800, and can be appropriately used as a component of a timing device of a moving object such as a self-propelled robot, a self-propelled conveying apparatus, a train, a vessel, a plane, a satellite, and the like. In any case, the excellent moving object which reflects the effects described in the embodiments and the modification examples can be provided.

While the resonator element, the resonator, the oscillator, the electronic device, and the moving object according to the invention have been described on the basis of the embodiments illustrated, the invention is not limited thereto, and the configuration of each part can be substituted with an arbitrary configuration having the same function. In addition, other arbitrary structures may also be added to the invention. In addition, as described above, while the embodiments have been described in detail, it is natural that various modifications can be made without practically departing from the new respects and effects of the invention. Therefore, such modification examples are included in the scope of the invention.

For example, in each of the embodiments and the modification examples, the description is provided using quartz crystal as the main material of the resonator element. However, a material other than the quartz crystal can be used.

For example, an oxide substrate (piezoelectric material) such as lithium tantalate ($LiTaO_3$), lithium tetraborate ($Li_2B_4O_7$), lithium niobate ($LiNbO_3$), lead zirconate titanate (PZT), zinc oxide (ZnO), aluminum nitride (AlN), langasite ($La_3Ga_5SiO_{14}$), potassium niobate ($KNbO_3$), gallium phosphate ($GaPO_4$), gallium arsenide (GaAs), barium titanate ($BaTiO_3$), lead titanate ($PbPO_3$), sodium potassium niobate (($K,Na)NbO_3$), bismuth ferrite ($BiFeO_3$), sodium niobate ($NaNbO_3$), bismuth titanate ($Bi_4Ti_3O_{12}$) and bismuth sodium titanate ($Na_{0.5}Bi_{0.5}TiO_3$), a layered piezoelectric substrate configured by laminating a piezoelectric material such as aluminum nitride (AlN) or tantalum pentoxide ($Ta_2O_5$) on a glass substrate, a piezoelectric ceramic, and a semiconductor material such as silicon (Si) can be used.

In addition, the drive type of the resonator element may be an electrostatic drive type by Coulomb's force or a Lorentz drive type using magnetic force other than the piezoelectric drive type by the above-described piezoelectric effect of the piezoelectric body.

Furthermore, the resonator element according to the invention can be applied to various sensors such as a gyro sensor, an acceleration sensor, a pressure sensor, and a tilt sensor using characteristics of changing frequencies with an action of a physical quantity such as angular velocity, acceleration, or pressure.

The entire disclosure of Japanese Patent Application No. 2012-276555, filed Dec. 19, 2012 is expressly incorporated by reference herein.

What is claimed is:

1. A resonator element comprising:
a base portion which includes, in plan view, a first end portion, a second end portion disposed at an opposite side of the base portion with respect to the first end portion, a third end portion that interconnects a first end of the first end portion and a first end of the second end portion, and a fourth end portion that interconnects a second end of the first end portion and a second end of the second end portion; and
first and second vibrating arms which extend from the first end portion of the base portion, the first and second vibrating arms extending along a first direction and being arranged in order from the third end portion side to the fourth end portion side, wherein
the first vibrating arm includes a first arm portion that extends from the base portion and a first mass portion that is disposed at an end of the first arm portion away from the base portion, the first mass portion having a width in a second direction crossing the first direction that is greater than a width of the first arm portion in the second direction, and
the third end portion has a shape, in the plan view, which includes a protruding portion that protrudes in the second direction beyond a first straight line that connects the first end of the first end portion to the first end of the second end portion, a tip of the protruding portion is disposed between the first straight line and a first virtual line that extends in the first direction from a side of the first mass portion that faces in a same direction faced by the third end portion.

2. The resonator element according to claim 1, wherein the second vibrating arm includes a second arm portion that extends from the base portion and a second mass portion that is disposed at an end of the second arm portion away from the base portion, the second mass portion having a width in the second direction that is greater than a width of the second arm portion in the second direction, and
the fourth end portion has a shape, in the plan view, which includes a second protruding portion that protrudes in the second direction beyond a second straight line that connects the second end of the first end portion to the second end of the second end portion, a tip of the second protruding portion is disposed between the second straight line and a second virtual line that extends in the first direction from a side of the second mass portion that faces in a same direction faced by the fourth end portion.

3. The resonator element according to claim 1, wherein the protruding portion connected the resonator element to a mother material before being separated from the mother material by cutting part of the protruding portion.

4. The resonator element according to claim 2, wherein the protruding portion and the second protruding portion connected the resonator element to a mother material before being separated from the mother material by cutting parts of the protruding portion and the second protruding portion.

5. The resonator element according to claim 1, further comprising:
a holding portion that extends in the first direction from the first end portion of the base portion between the first and second vibrating arms.

6. The resonator element according to claim 2, further comprising:
a holding portion that extends in the first direction from the first end portion of the base portion between the first and second vibrating arms.

7. A vibrator comprising:
the resonator element according to claim 1; and
a container that accommodates the resonator element.

8. A vibrator comprising:
the resonator element according to claim 2; and
a container that accommodates the resonator element.

9. An oscillator comprising:
the resonator element according to claim 1; and
a circuit coupled to the resonator element.

10. An oscillator comprising:
the resonator element according to claim 2; and
a circuit coupled to the resonator element.

11. An electronic device comprising:
the resonator element according to claim 1.

12. An electronic device comprising:
the resonator element according to claim 2.

13. A moving body comprising:
the resonator element according to claim 1.

14. A moving body comprising:
the resonator element according to claim 2.

15. A method of manufacturing the resonator element of claim 1, comprising:

preparing a mother material to which the resonator element is connected, the resonator element being connected to the mother material via the protruding portion; and separating the resonator element from the mother material by folding part of the protruding portion.

16. A method of manufacturing the resonator element of claim 2, comprising:

preparing a mother material to which the resonator element is connected, the resonator element being connected to the mother material via the protruding portion and the second protruding portion; and separating the resonator element from the mother material by folding part of the protruding portion and part of the second protruding portion.

* * * * *